US010453864B2

(12) United States Patent
Suk et al.

(10) Patent No.: US 10,453,864 B2
(45) Date of Patent: Oct. 22, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Sung Dae Suk, Seoul (KR); Geum Jong Bae, Suwon-si (KR); Joo Hee Jeong, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 6 days.

(21) Appl. No.: 15/843,139

(22) Filed: Dec. 15, 2017

(65) Prior Publication Data

US 2018/0175070 A1     Jun. 21, 2018

(30) Foreign Application Priority Data

Dec. 15, 2016   (KR) ........................ 10-2016-0171662

(51) Int. Cl.
| | |
|---|---|
| *H01L 27/12* | (2006.01) |
| *H01L 29/06* | (2006.01) |
| *H01L 23/52* | (2006.01) |
| *H01L 23/528* | (2006.01) |
| *H01L 29/10* | (2006.01) |
| *H01L 27/02* | (2006.01) |
| *H01L 21/762* | (2006.01) |
| *H01L 21/84* | (2006.01) |

(Continued)

(52) U.S. Cl.
CPC ........ *H01L 27/1211* (2013.01); *H01L 21/185* (2013.01); *H01L 21/30604* (2013.01); *H01L 21/31111* (2013.01); *H01L 21/76251* (2013.01); *H01L 21/76283* (2013.01); *H01L 21/845* (2013.01); *H01L 23/528* (2013.01); *H01L 23/5226* (2013.01); *H01L 27/0207* (2013.01); *H01L 29/0649* (2013.01); *H01L 29/1033* (2013.01); *H01L 29/7391* (2013.01)

(58) Field of Classification Search
CPC .................................................. H01L 29/1033
See application file for complete search history.

(56) References Cited

U.S. PATENT DOCUMENTS

| | | |
|---|---|---|
| 8,716,805 B2 | 5/2014 | Fujita |
| 8,722,472 B2 | 5/2014 | Chang et al. |

(Continued)

*Primary Examiner* — Moazzam Hossain
*Assistant Examiner* — Omar F Mojaddedi
(74) *Attorney, Agent, or Firm* — Lee & Morse, P.C.

(57) ABSTRACT

A semiconductor device includes a base substrate, a buried insulating film on the base substrate, a first semiconductor substrate pattern on the buried insulating film, a second semiconductor substrate pattern on the buried insulating film, the second semiconductor substrate pattern being spaced apart from the first semiconductor substrate pattern, a first device pattern on the first semiconductor substrate pattern, a second device pattern on the second semiconductor substrate pattern, the first and second device patterns having different characteristics from each other, an isolating trench between the first semiconductor substrate pattern and the second semiconductor substrate pattern, the isolating trench extending only partially into the buried insulating film, and a lower interlayer insulating film overlying the first device pattern and the second device pattern and filling the isolating trench.

20 Claims, 36 Drawing Sheets

(51) Int. Cl.
    *H01L 21/306*     (2006.01)
    *H01L 21/311*     (2006.01)
    *H01L 21/18*     (2006.01)
    *H01L 23/522*     (2006.01)
    *H01L 29/739*     (2006.01)

(56) References Cited

U.S. PATENT DOCUMENTS

| | | |
|---|---|---|
| 8,836,073 B1 | 9/2014 | Or-Bach et al. |
| 9,184,301 B2 | 11/2015 | Bangsaruntip et al. |
| 9,202,788 B2 | 12/2015 | Okuno et al. |
| 9,219,005 B2 | 12/2015 | Or-Bach et al. |
| 9,460,978 B1 | 10/2016 | Or-Bach et al. |
| 9,755,017 B1 * | 9/2017 | Guillorn ............. H01L 29/0673 |
| 2007/0057302 A1 * | 3/2007 | Ho .................... H01L 27/10861<br>257/301 |
| 2007/0164443 A1 * | 7/2007 | Florian ................ H01L 21/743<br>257/774 |
| 2013/0341596 A1 | 12/2013 | Chang et al. |
| 2017/0084531 A1 * | 3/2017 | Gu .................... H01L 23/49894 |

\* cited by examiner

SEMICONDUCTOR DEVICE AND METHOD FOR FABRICATING THE SAME

CROSS-REFERENCE TO RELATED APPLICATION

Korean Patent Application No. 10-2016-0171662, filed on Dec. 15, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same, and more particularly, to a semiconductor device in which different types of transistors are mixed on one substrate and a method for fabricating the same.

2. Description of the Related Art

For semiconductor device density enhancement, a multigate transistor has been suggested as a scaling technology. The multigate transistor includes multi-channel active pattern (or silicon body) in a fin or nanowire shape on a substrate, with gates being formed on a surface of the multi-channel active pattern. However, scaling techniques for enhancing the density of semiconductor devices has approached the limits. Further, studies are under way to improve the performance of semiconductor devices by implementing various kinds of devices in one semiconductor device.

SUMMARY

According to an exemplary embodiment, a semiconductor device includes a base substrate, a buried insulating film on the base substrate, a first semiconductor substrate pattern on the buried insulating film, a second semiconductor substrate pattern on the buried insulating film, the second semiconductor substrate pattern being spaced apart from the first semiconductor substrate pattern, a first device pattern including a first gate electrode on the first semiconductor substrate pattern, a second device pattern including a second gate electrode on the second semiconductor substrate pattern, an isolating trench formed between the first semiconductor substrate pattern and the second semiconductor substrate pattern and within the buried insulating film, the isolating trench including a first sidewall and a second sidewall facing each other, and a lower interlayer insulating film overlying the first device pattern and the second device pattern and filling the isolating trench, wherein the first sidewall of the isolating trench is defined by the first semiconductor substrate pattern and the buried insulating film, and the second sidewall of the isolating trench is defined by the second semiconductor substrate pattern and the buried insulating film, the first sidewall of the isolating trench defined by the first semiconductor substrate pattern and the first sidewall of the isolating trench defined by the buried insulating film are continuous, and the second sidewall of the isolating trench defined by the second semiconductor substrate pattern and the second sidewall of the isolating trench defined by the buried insulating film are continuous.

According to another exemplary embodiment, a semiconductor device includes a base substrate, a buried insulating film on the base substrate, a first semiconductor substrate pattern on the buried insulating film, a second semiconductor substrate pattern on the buried insulating film, the second semiconductor substrate pattern being spaced apart from the first semiconductor substrate pattern, a first device pattern on the first semiconductor substrate pattern, a second device pattern on the second semiconductor substrate pattern, an isolating trench formed between the first semiconductor substrate pattern and the second semiconductor substrate pattern and within the buried insulating film, the isolating trench including a first sidewall and a second sidewall facing each other, and a lower interlayer insulating film overlying the first device pattern and the second device pattern and filling the isolating trench, wherein a connecting portion between the first sidewall of the isolating trench and a bottom surface of the isolating trench is rounded, and a connecting portion between the second sidewall of the isolating trench and the bottom surface of the isolating trench is not rounded.

According to still another exemplary embodiment, a semiconductor device includes a base substrate, a buried insulating film on the base substrate, a first semiconductor substrate pattern on the buried insulating film, a second semiconductor substrate pattern on the buried insulating film, the second semiconductor substrate pattern being spaced apart from the first semiconductor substrate pattern, a first device pattern on the first semiconductor substrate pattern, a second device pattern on the second semiconductor substrate pattern, an isolating trench formed between the first semiconductor substrate pattern and the second semiconductor substrate pattern and within the buried insulating film, the isolating trench including a first sidewall and a second sidewall facing each other, an interlayer insulating film overlying the first device pattern and the second device pattern and filling the isolating trench, a third semiconductor substrate pattern on the interlayer insulating film, the third semiconductor substrate pattern including a first surface and a second surface facing each other, and a third device pattern on the first surface of the third semiconductor substrate pattern.

According to still another exemplary embodiment, a method for fabricating a semiconductor device includes providing a first substrate, the first substrate including a first device region and a second device region and including a first base substrate, a first buried insulating film, and a first semiconductor substrate that are stacked sequentially, providing a second substrate including a third device region corresponding to the first device region and a fourth device region corresponding to the second device region, forming a first device pattern on the first semiconductor substrate in the first device region, etching the first semiconductor substrate in the second device region to form a first trench for exposing the first buried insulating film, forming a first interlayer insulating film on the first substrate, the first interlayer insulating film overlying the first device pattern and filling the first trench, etching the first interlayer insulating film in the second device region to form a first device substrate structure for exposing the first buried insulating film in the second device region, forming a second device pattern on the second substrate in the fourth device region, removing a portion of the second substrate in the third device region to form a second trench, forming a second interlayer insulating film on the second substrate, the second interlayer insulating film overlying the second device pattern and filling the second trench, forming a second device substrate structure on the a substrate supporter by bonding the second interlayer insulating film to the substrate supporter, and then removing at least a portion of the second substrate and the second interlayer insulating film in the third device region, and forming a device junction substrate by bonding the first device substrate structure and the second device substrate structure.

According to still another exemplary embodiment, a semiconductor device includes a base substrate, a buried insulating film on the base substrate, a first semiconductor substrate pattern on the buried insulating film, a second semiconductor substrate pattern on the buried insulating film, the second semiconductor substrate pattern being spaced apart from the first semiconductor substrate pattern, a first device pattern on the first semiconductor substrate pattern, a second device pattern on the second semiconductor substrate pattern, the first and second device patterns having different characteristics from each other, an isolating trench between the first semiconductor substrate pattern and the second semiconductor substrate pattern, the isolating trench extending only partially into the buried insulating film, and a lower interlayer insulating film overlying the first device pattern and the second device pattern and filling the isolating trench.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
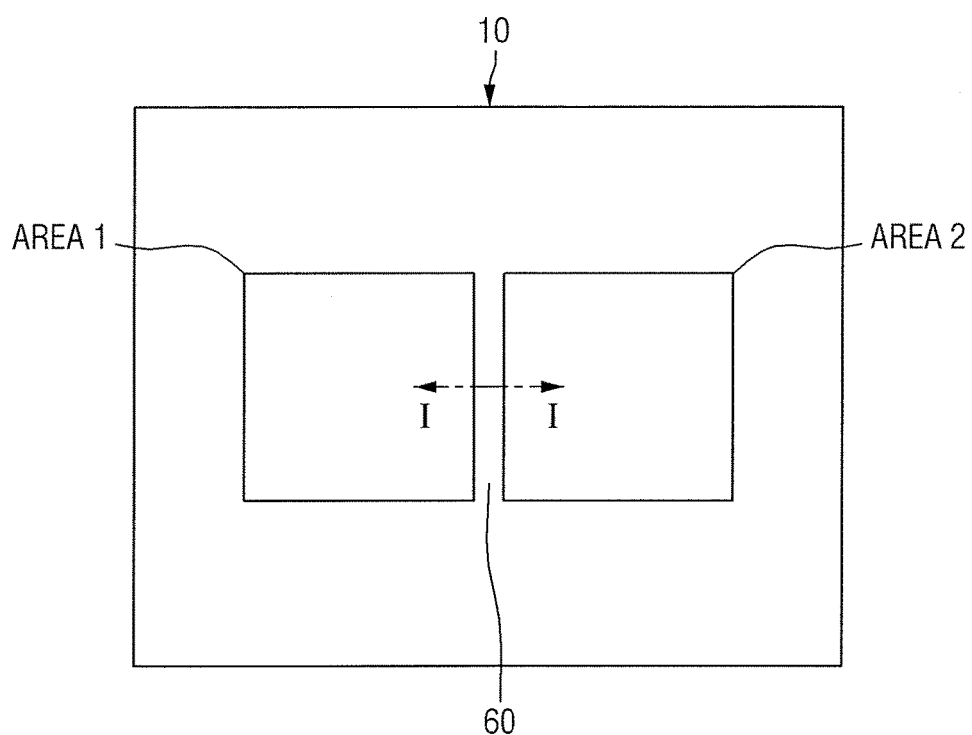
FIG. 1 illustrates a schematic layout view of a semiconductor device according to some exemplary embodiments.
Figure 2:
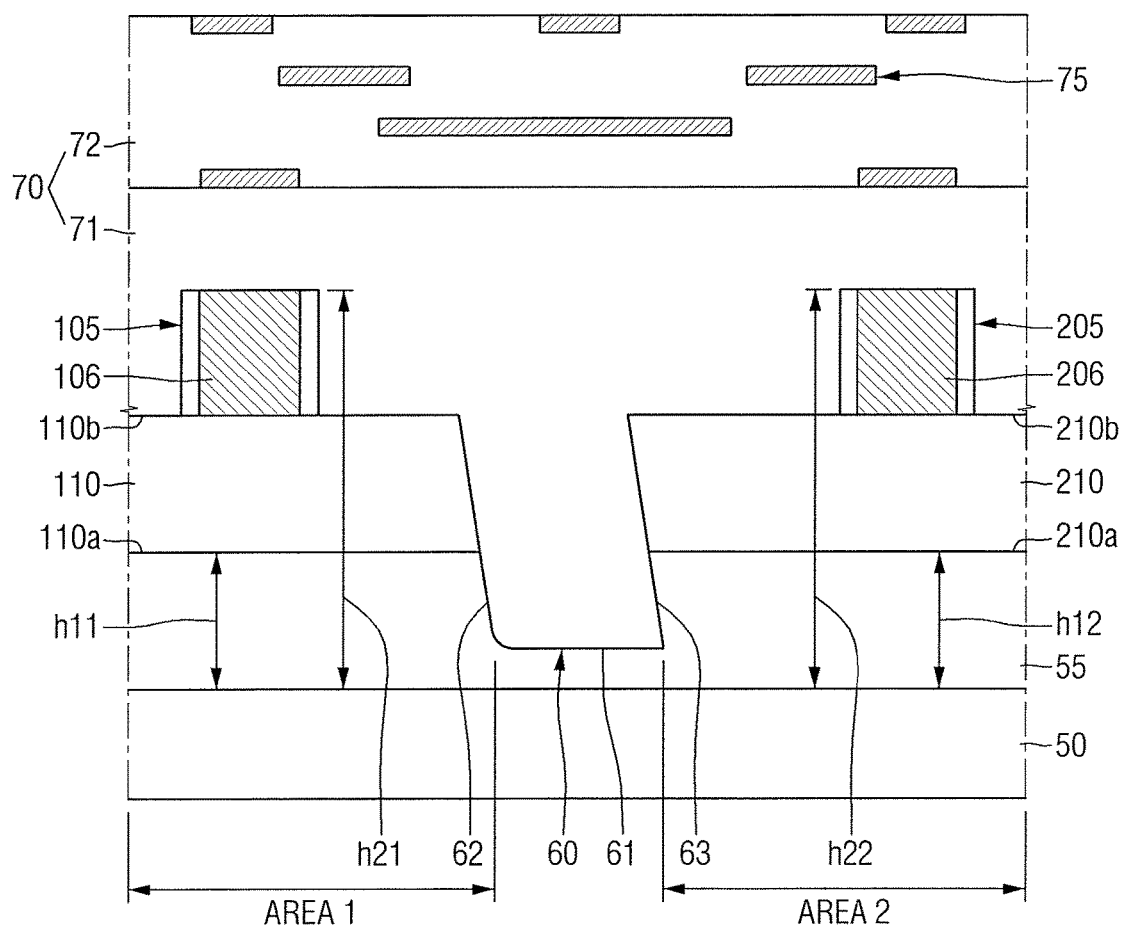
FIG. 2 illustrates a cross sectional view along line I-I of FIG. 1.

FIG. 1 is a schematic layout view of a semiconductor device according to some exemplary embodiments. FIG. 2 is a cross sectional view taken along line I-I of FIG. 1.

Referring to FIGS. 1 and 2, a semiconductor device 10 according to some exemplary embodiments may include a first device pattern 105, a second device pattern 205, a first semiconductor substrate pattern 110, a second semiconductor substrate pattern 210, a buried insulating film 55, and an isolating trench 60 on a base substrate 50.

The base substrate 50 may include a first device region AREA 1 and a second device region AREA 2 which are adjacent to each other. The first device region AREA 1 and the second device region AREA 2 may be separated by the isolating trench 60.

The base substrate 50 may include one of, e.g., silicon (Si), silicon germanium (SiGe), indium antimonide (InSb), lead telluride (PbTe), indium arsenide (InAs), indium phosphide (InP), gallium arsenide (GaAs), gallium antimonide (GaSb), and combinations thereof, but not limited thereto. In the semiconductor device according to some exemplary embodiments, it is described that the base substrate 50 is a silicon substrate.

The buried insulating film 55 may be formed on the base substrate 50. The buried insulating film 55 may be in contact with the base substrate 50. As used herein, the term "contact" may mean that no insertion film is formed between the buried insulating film 55 and the base substrate 50.

The buried insulating film 55 may include an insulating material. The buried insulating film 55 may include, e.g., silicon oxide ($SiO_2$). The buried insulating film 55 may serve as an adhesive film for bonding the second semiconductor substrate pattern 210 and the base substrate 50. These will be described in detail by referring to a fabricating method.

The first semiconductor substrate pattern 110 may be formed on the buried insulating film 55. The first semiconductor substrate pattern 110 may be in contact with the buried insulating film 55.

The first semiconductor substrate pattern 110 may be formed in the first device region AREA 1. The first device region AREA 1 may be defined by the first semiconductor substrate pattern 110.

The first semiconductor substrate pattern 110 may include a first surface 110a, e.g., a lower surface, and a second surface 110b facing each other. The first surface 110a of the first semiconductor substrate pattern 110 may face the buried insulating film 55. That is, the first surface 110a of the first semiconductor substrate pattern 110 may be in contact with the buried insulating film 55.

The second semiconductor substrate pattern 210 may be formed on the buried insulating film 55. The second semiconductor substrate pattern 210 may be in contact with the buried insulating film 55.

The second semiconductor substrate pattern 210 may be formed in the second device region AREA 2. The second device region AREA 2 may be defined by the second semiconductor substrate pattern 210. The second semiconductor substrate pattern 210 is spaced apart from the first semiconductor substrate pattern 110.

The second semiconductor substrate pattern 210 may include a first surface 210a and a second surface 210b facing each other. The first surface 210a of the second semiconductor substrate pattern may face the buried insulating film 55. That is, the first surface 210a of the second semiconductor substrate pattern may be in contact with the buried insulating film 55. For example, a thickness h11 of the buried insulating film 55 between the first semiconductor substrate pattern 110 and the base substrate 50 may be equal to a thickness h12 of the buried insulating film 55 between the second semiconductor substrate pattern 210 and the base substrate 50.

The first semiconductor substrate pattern 110 and the second semiconductor substrate pattern 210 may each include an element semiconductor material, e.g., silicon or germanium. Further, the first semiconductor substrate pattern 110 and the second semiconductor substrate pattern 210 may each include a compound semiconductor, e.g., a Group IV-IV compound semiconductor or a Group III-V compound semiconductor.

For example, if the first semiconductor substrate pattern 110 and the second semiconductor substrate pattern 210 include the Group IV-IV compound semiconductor, each of the first and second semiconductor substrate patterns 110 and 210 may be a binary compound or a ternary compound including two or more of carbon (C), silicon (Si), germanium (Ge), and tin (Sn), or the above compounds doped with a Group IV element, respectively. In another example, if the first semiconductor substrate pattern 110 and the second semiconductor substrate pattern 210 include the Group III-V compound, each of the first and second semiconductor substrate patterns 110 and 210 may be one of a binary compound, a ternary compound, or a quaternary compound which is formed by a combination of a Group III element, which may be at least one of aluminum (Al), gallium (Ga), or indium (In), and a Group V element, which may be one of phosphorus (P), arsenic (As), and antimony (Sb).

The first semiconductor substrate pattern 110 and the second semiconductor substrate pattern 210 may include the same material, or different materials from each other. Alternatively, the first semiconductor substrate pattern 110 and the second semiconductor substrate pattern 210 may have different epitaxial films from each other formed on the same substrate.

The thickness of the first semiconductor substrate pattern 110 may be the same as, or different from the thickness of the second semiconductor substrate pattern 210. Further, the height from the base substrate 50 to the second surface 110b of the first semiconductor substrate pattern may be the same as, or different from the height from the base substrate 50 to the second surface 210b of the second semiconductor substrate pattern.

The first device pattern 105 may be formed on the first semiconductor substrate pattern 110. The first device pattern 105 may be formed on the second surface 110b of the first semiconductor substrate pattern 110. The first device pattern 105 may include a first gate electrode 106. For example, the first device pattern 105 may include a first transistor, e.g., the first device pattern 105 may be a first transistor.

The second device pattern 205 may be formed on the second semiconductor substrate pattern 210. The second device pattern 205 may be formed on the second surface 210b of the second semiconductor substrate pattern 210. The second device pattern 205 may include a second gate electrode 206. For example, the second device pattern 205 may include a second transistor, e.g., e.g., the first device pattern 105 may be a first transistor.

Referring to FIG. 2, the shapes of the first and second device patterns 105 and 205, i.e., the shapes of the first and second transistors, are shown briefly, but are not limited thereto. That is, the first device pattern 105 may include the first gate electrode 106, a source/drain region of the first transistor, and a channel region of the first transistor between the source/drain region. Likewise, the second device pattern 205 may include the second gate electrode 206, a source/drain region, and a channel region between the source/drain region.

In the semiconductor device according to some exemplary embodiments, each of the first device pattern 105 and the second device pattern 205 may include one of a planar transistor, a fin-type transistor (FinFET) including a fin-type pattern channel region, a tunneling transistor (tunneling FET), a Gate-All-Around (GAA) transistor including a nanowire or nanosheet channel region, or a vertical transistor in which a channel region is arranged in the thickness direction of the substrate, but not limited thereto. That is, the shape of the transistor is not limited to the specific types described above.

The shape of the first device pattern 105 and the shape of the second device pattern 205 may be different from each other. For example, the shape of the channel region of the first transistor may be different from the shape of the channel region of the second transistor. For example, when the channel region of the first transistor is in a fin-type pattern shape and the channel region of the second transistor is of a nanowire shape, the shape of the channel region of the first transistor may be different from the shape of the channel region of the second transistor.

The material of the channel region of the first transistor may be the same as or different from the material of the channel region of the second transistor. For example, the material of the channel region of the first transistor and the material of the channel region of the second transistor may be different from each other when the shape of the first device pattern 105 and the shape of the second device pattern 205 are the same. In another example, when the channel region of the first transistor and the channel region of the second transistor are in a fin-type pattern shape, and when the material of the channel region of the first transistor includes silicon or silicon germanium and the material of the channel region of the second transistor includes III-V compound semiconductor, the first device pattern 105 and the second device pattern 205 having the same shape may have different materials for the channel region of the first transistor and the channel region of the second transistor may be different from each other.

As illustrated in FIG. 2, a height h21 from the base substrate 50 to an upper surface of the first gate electrode 106 may be equal to a height h22 from the base substrate 50 to an upper surface of the second gate electrode 206, but this is provided only for convenience of explanation and the exemplary embodiments are not limited thereto. Further, as illustrated in FIG. 2, the width of the first gate electrode 106 between the source/drain region of the first transistor may be equal to the width of the second gate electrode 206 between the source/drain region of the second transistor, but this is provided only for convenience of explanation and the exemplary embodiments are not limited thereto.

The isolating trench 60 may be formed between the first semiconductor substrate pattern 110 and the second semiconductor substrate pattern 210. Further, the isolating trench 60 may be formed within the buried insulating film 55. The first semiconductor substrate pattern 110 and the second semiconductor substrate pattern 210 may be separated by the isolating trench 60.

The isolating trench 60 may include a first sidewall 62 and a second sidewall 63 facing each other. The isolating trench 60 may include a bottom surface 61 connecting the first sidewall 62 of the isolating trench 60 to the second sidewall 63 of the isolating trench 60.

The first sidewall 62 of the isolating trench 60 may be defined by the first semiconductor substrate pattern 110 and the buried insulating film 55. The second sidewall 63 of the isolating trench 60 may be defined by the second semiconductor substrate pattern 210 and the buried insulating film 55. The bottom surface 61 of the isolating trench may be defined by the buried insulating film 55.

For example, the connecting portion between the first sidewall 62 of the isolating trench 60 and the bottom surface 61 of the isolating trench 60 may be rounded. However, the connecting portion between the second sidewall 63 of the isolating trench 60 and the bottom surface 61 of the isolating trench 60 may not be rounded. That is, the connecting portion between the second sidewall 63 of the isolating trench and the bottom surface 61 of the isolating trench may have an angular shape, e.g., with a sharp edge.

More specifically, the connecting portion between a portion of the first sidewall 62 of the isolating trench 60 defined by the buried insulating film 55 and the bottom surface 61 of the isolating trench 60 may be rounded. The connecting portion between a portion of the second sidewall 63 of the isolating trench defined by the buried insulating film 55, and the bottom surface 61 of the isolating trench may not be rounded.

A first part of the first sidewall 62 of the isolating trench 60 defined by the first semiconductor substrate pattern 110, and a second part of the first sidewall 62 of the isolating trench 60 defined by the buried insulating film 55 may be continuous. Further, a first part of the second sidewall 63 of the isolating trench defined by the second semiconductor substrate pattern 210, and a second part of the second sidewall 63 of the isolating trench defined by the buried insulating film 55 may be continuous.

The expression "sidewall is continuous" as used herein means that there is no protruding portion between the first part of the first sidewall 62 of the isolating trench defined by the first semiconductor substrate pattern 110 and the second part of the first sidewall 62 of the isolating trench defined by the buried insulating film 55, e.g., the first and second part of the first sidewall 62 are level and collinear with each other. That is, between the first part of the first sidewall 62 of the isolating trench 60 defined by the first semiconductor substrate pattern 110 and the second part of the first sidewall 62 of the isolating trench 60 defined by the buried insulating film 55, there may be no stepped portion formed by the upper surface of the buried insulating film 55 in contact with the first surfaces 110a and 210a of the first and second semiconductor substrate patterns.

The first sidewall 62 of the isolating trench 60 and the second sidewall 63 of the isolating trench 60 may be tilted in the same direction. For example, the first sidewall 62 of the isolating trench 60 may form an obtuse angle with the bottom surface 61 of the isolating trench 60, and the second sidewall 63 of the isolating trench 60 may form an acute angle with the bottom surface 61 of the isolating trench 60.

In addition, the first surface 110a of the first semiconductor substrate pattern 110 and the first sidewall 62 of the isolating trench 60 defined by the first semiconductor substrate pattern 110 may form an acute angle. On the other hand, the first surface 210a of the second semiconductor substrate pattern 210 and the second sidewall 63 of the isolating trench 60 defined by the second semiconductor substrate pattern 210 may form an obtuse angle.

As illustrated in FIG. 2, the first part of the first sidewall 62 of the isolating trench 60 defined by the first semiconductor substrate pattern 110 and the second part of the first sidewall 62 of the isolating trench 60 defined by the buried insulating film 55 may have the same slope. The first part of the second sidewall 63 of the isolating trench 60 defined by the second semiconductor substrate pattern 210 and the second part of the second sidewall 63 of the isolating trench 60 defined by the buried insulating film 55 may have the same slope. However, this is provided only for convenience of explanation and the exemplary embodiments are not limited thereto.

A first interlayer insulating film 70 may be formed on the first semiconductor substrate pattern 110 and the second semiconductor substrate pattern 210. The first interlayer insulating film 70 may include a first lower interlayer insulating film 71 and a first upper interlayer insulating film 72. The first lower interlayer insulating film 71 may overlie the first device pattern 105 and the second device pattern 205. The first lower interlayer insulating film 71 may fill the isolating trench 60. The first upper interlayer insulating film 72 may be formed on the first lower interlayer insulating film 71.

For example, the first lower interlayer insulating film 71 and the first upper interlayer insulating film 72 may each include silicon oxide, silicon nitride, silicon oxynitride, flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

A first integration interconnect wire 75 may be formed within the first upper interlayer insulating film 72. The first integration interconnect wire 75 may be electrically connected to the first device pattern 105 and to the second device pattern 205. That is, the first integration interconnect wire 75 may electrically connect the first device pattern 105 to the second device pattern 205. A portion of the first integration interconnect wire 75 may be formed across the isolating trench 60.

The density of the semiconductor device can be enhanced by implementing the first and second device patterns 105 and 205 having different characteristics on one single base substrate 50 by using the substrate junction technique. Further, as the first device pattern 105 and the second device pattern 205 are formed through separate fabricating processes, the fabricating process of the first device pattern 105 does not act as a process limiting factor of the fabricating process of the second device pattern 205, thereby enabling the first device pattern 105 and the second device pattern 205 to exhibit optimized performance. Accordingly, the characteristics of the semiconductor device can be improved.

FIGS. 3 to 6 are cross-sectional views along line I-I of FIG. 1 according to some other exemplary embodiments. For convenience of explanation, the description will be focused on the differences relative to FIG. 2.

Figure 3:
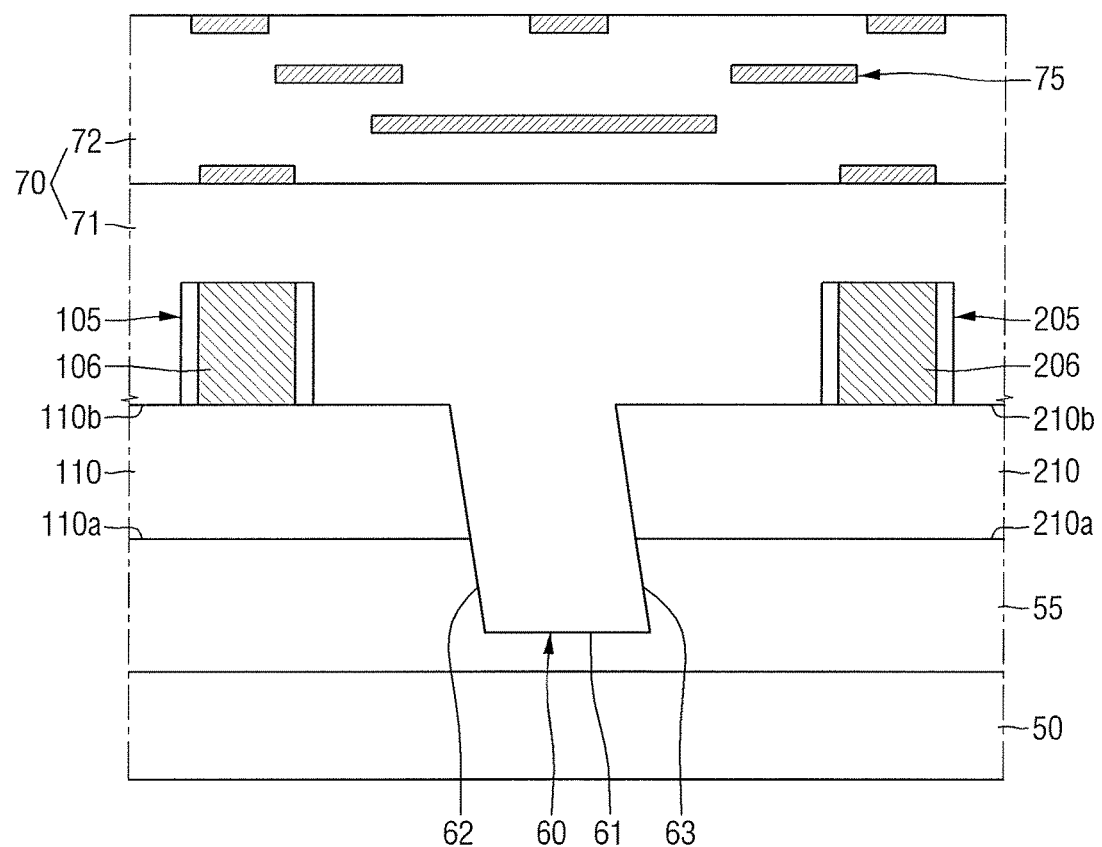
FIGS. 3 to 18 illustrate cross-sectional views of a semiconductor device according to some exemplary embodiments.

Referring to FIG. 3, in a semiconductor device according to some exemplary embodiments, the connecting portion between the first sidewall 62 of the isolating trench and the bottom surface 61 of the isolating trench may not be rounded. That is, the connecting portion between the second part of the first sidewall 62 of the isolating trench 60 defined by the buried insulating film 55 and the bottom surfaces 61 of the isolating trench may not be rounded. In other words, the connecting portion between the first sidewall 62 of the isolating trench and the bottom surface 61 of the isolating trench may have an angular shape.

Figure 4:
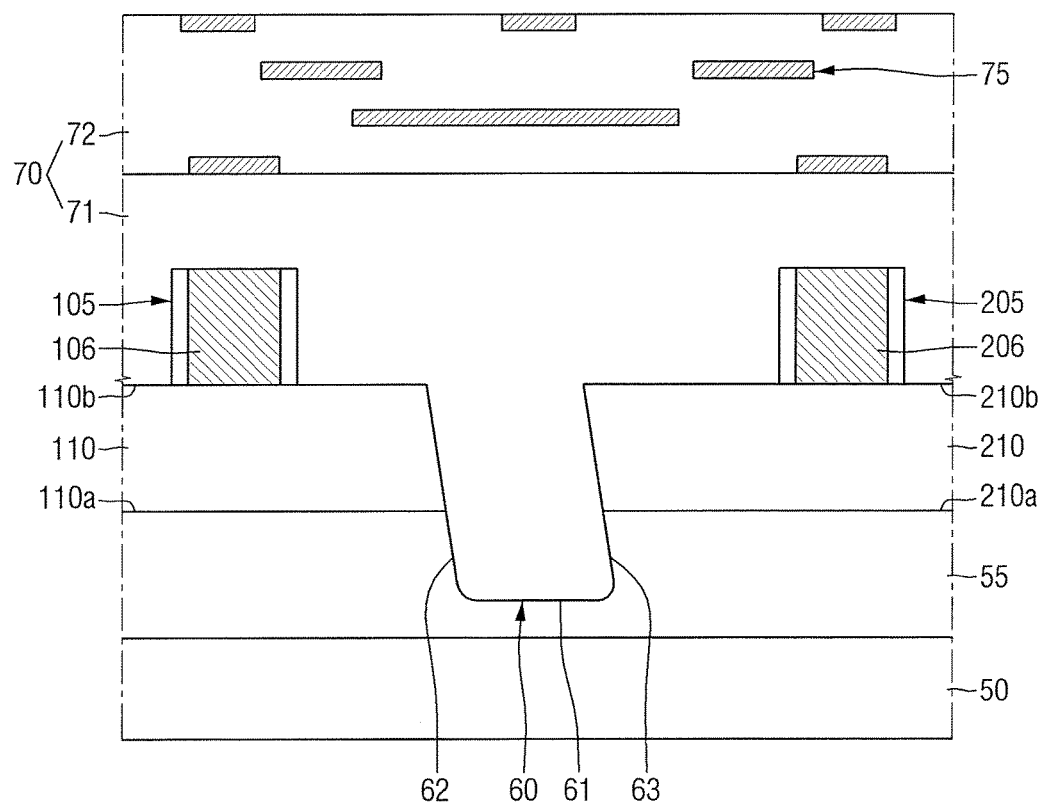

Referring to FIG. 4, in a semiconductor device according to some exemplary embodiments, the connecting portion between the second sidewall 63 of the isolating trench and the bottom surface 61 of the isolating trench may be rounded. That is, the connecting portion between the second part of the second sidewall 63 of the isolating trench defined by the buried insulating film 55 and the bottom surfaces 61 of the isolating trench may be rounded.

The connecting portion between the second sidewall 63 of the isolating trench and the bottom surface 61 of the isolating trench may be rounded during the process of joining the second semiconductor substrate pattern 210 to the base substrate 50. More specifically, while the portion of the buried insulating film 55 defining the portion of the second sidewall 63 of the isolating trench is being joined with the portion of the buried insulating film 55 defining the bottom surface 61 of the isolating trench, the connecting portion between the second sidewall 63 of the isolating trench and the bottom surface 61 of the isolating trench may be rounded.

Figure 5:
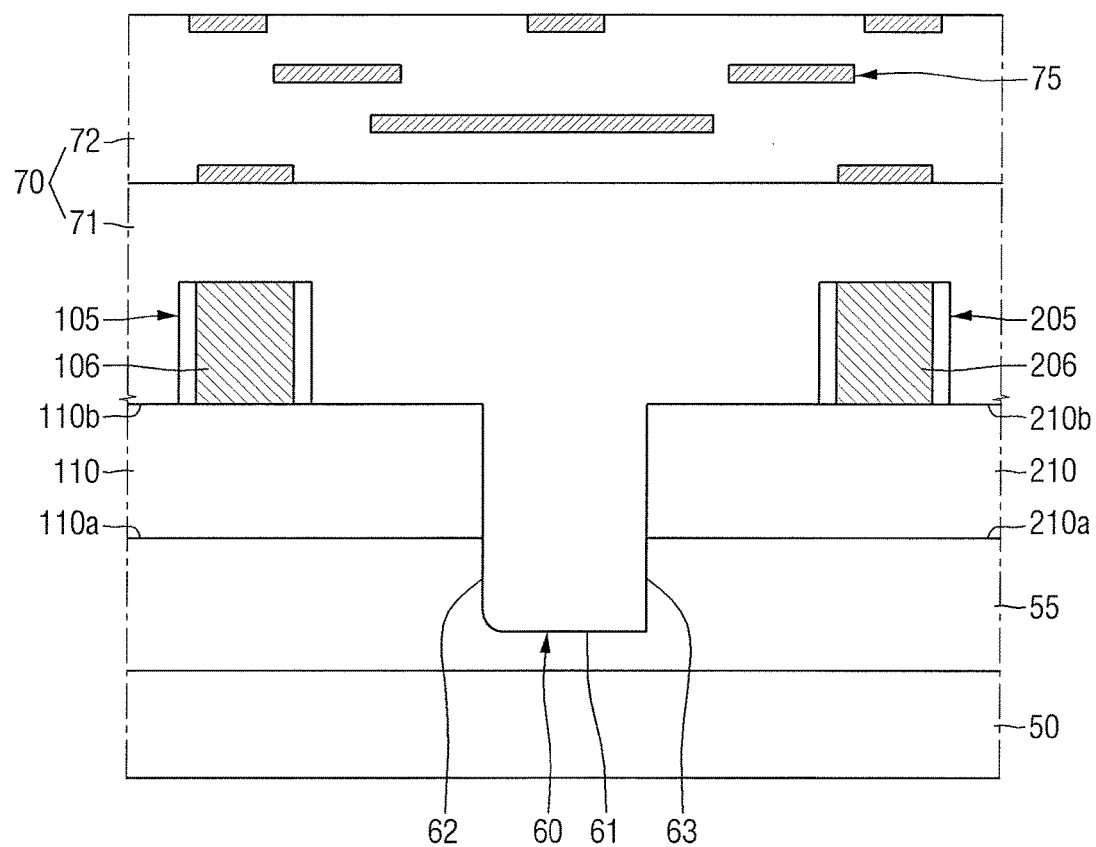

Referring to FIG. 5, in a semiconductor device according to some exemplary embodiments, an angle between the first sidewall 62 of the isolating trench and the bottom surface 61 of the isolating trench may be a right angle, and an angle between the second sidewall 63 of the isolating trench and the bottom surface 61 of the isolating trench may be a right angle. Further, the first surface 110a of the first semiconductor substrate pattern and the first sidewall 62 of the isolation trench defined by the first semiconductor substrate pattern 110 may form a right angle, and the first surface 210a of the second semiconductor substrate pattern and the second sidewall 63 of the isolation trench defined by the second semiconductor substrate pattern 210 may form a right angle.

Figure 6:
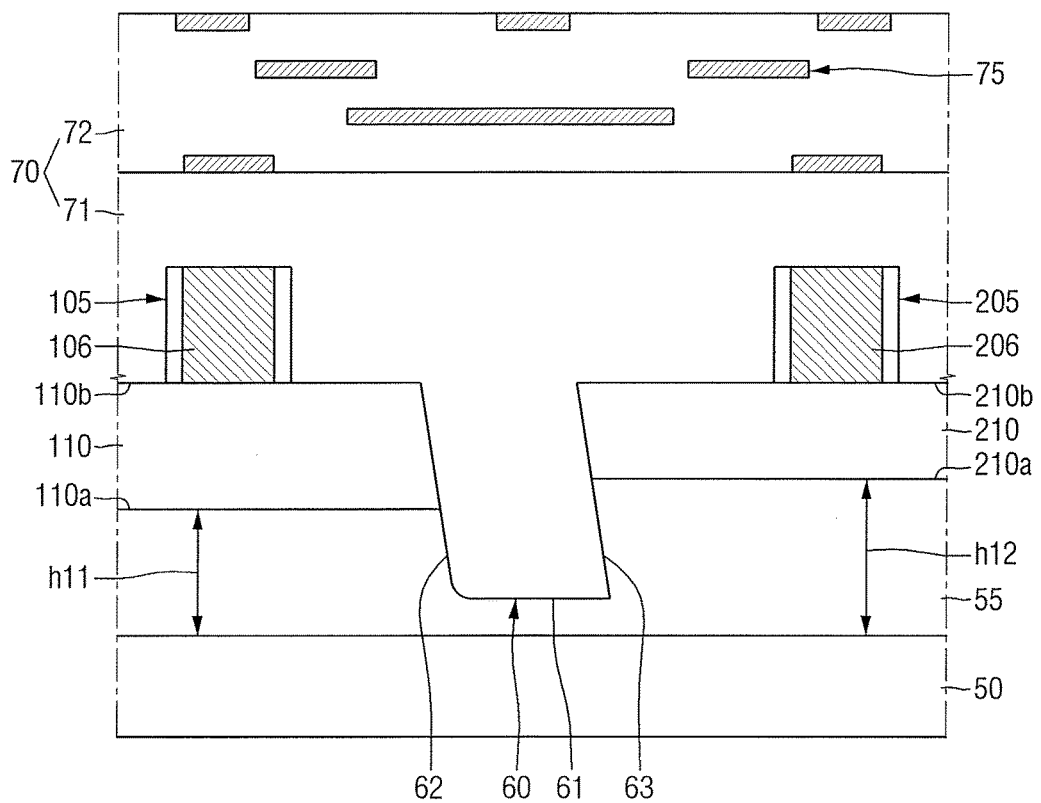

Referring to FIG. 6, in a semiconductor device according to some exemplary embodiments, the thickness h11 of the buried insulating film 55 between the first semiconductor substrate pattern 110 and the base substrate 50 may be different from the thickness h12 of the buried insulating film 55 between the second semiconductor substrate pattern 210 and the base substrate 50.

In an example, the thickness h11 of the buried insulating film 55 between the first semiconductor substrate pattern 110 and the base substrate 50 may be greater than the thickness h12 of the buried insulating film 55 between the second semiconductor substrate pattern 210 and the base substrate 50. In another example, as illustrated in FIG. 6, the thickness h11 of the buried insulating film 55 between the first semiconductor substrate pattern 110 and the base substrate 50 may be less than the thickness h12 of the buried insulating film 55 between the second semiconductor substrate pattern 210 and the base substrate 50. This is because the thickness h12 of the buried insulating film 55 between the second semiconductor substrate pattern 210 and the base substrate 50 may vary depending on the thickness of the silicon oxide film for joining the second semiconductor substrate pattern 210 to the base substrate 50.

Figure 7:
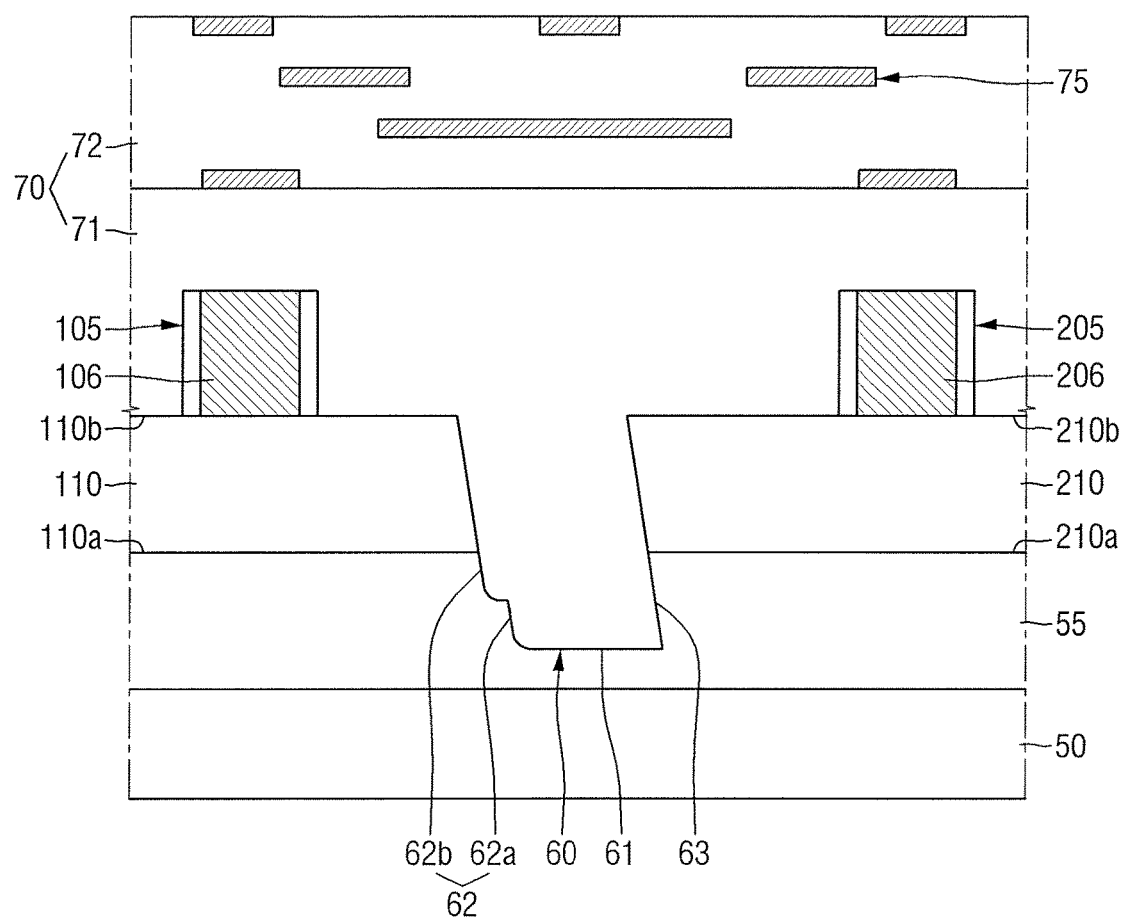

FIG. 7 is a cross-sectional view along line I-I of FIG. 1 according to some exemplary embodiments. For convenience of explanation, the description will be focused on the differences relative to FIG. 2.

Referring to FIG. 7, in a semiconductor device according to some exemplary embodiments, the first sidewall 62 of the isolating trench may include a first portion 62a and a second portion 62b.

The first portion 62a of the first sidewall of the isolating trench and the second portion 62b of the first sidewall of the isolating trench may have a slope which is an obtuse angle with respect to the bottom surface 61 of the isolating trench. The first sidewall 62 of the isolating trench 60 may include a connection that connects the first portion 62a of the first sidewall 62 of the isolating trench to the second portion 62b of the first sidewall 62 of the isolating trench 60. The connection of the first sidewall 62 of the isolating trench 60 may be a portion extending in a direction parallel to the base substrate 50.

As illustrated in FIG. 7, the connection of the first sidewall 62 of the isolating trench 60 may be defined by the buried insulating film 55, although exemplary embodiments are not limited thereto. That is, it may vary depending on an amount of the first semiconductor substrate pattern 110 being removed in the process of forming the second portion 62b of the first sidewall 62 of the isolating trench 60.

Figure 8:
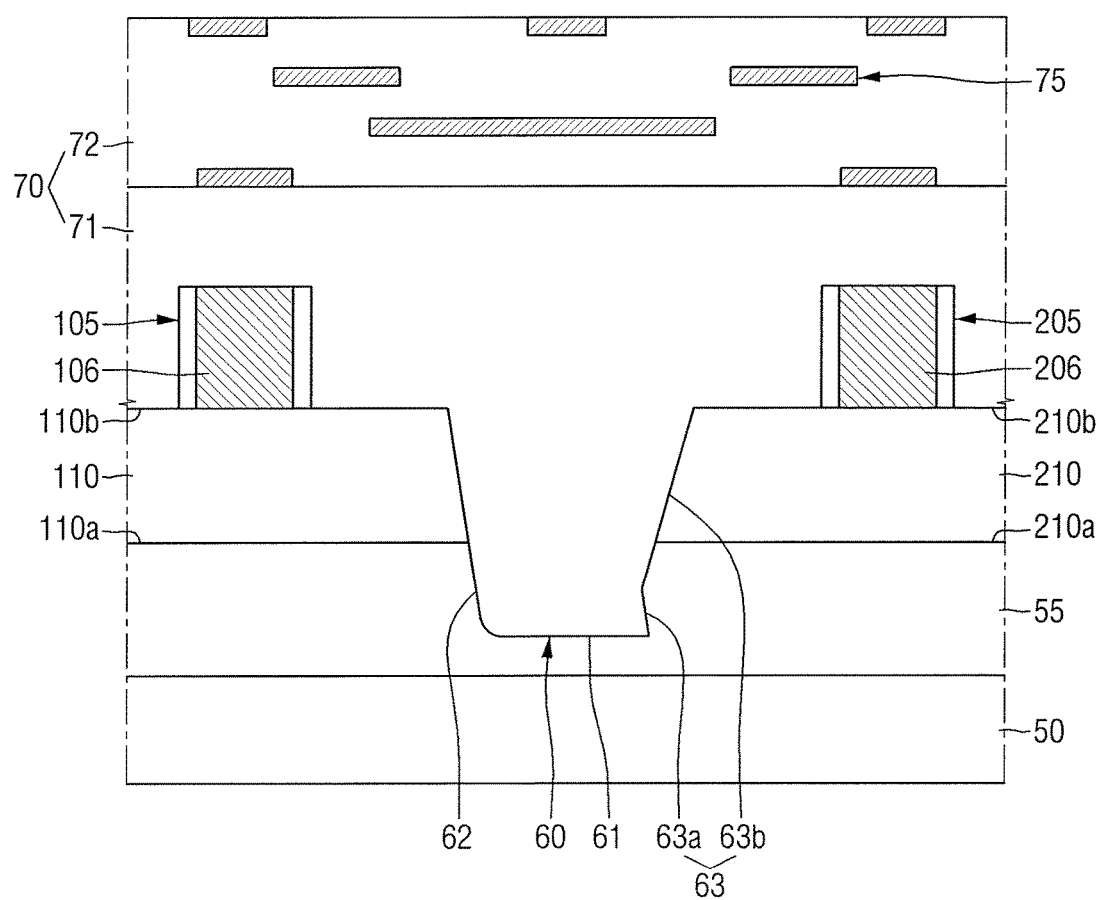

FIG. 8 is a cross-sectional view along line I-I of FIG. 1 according to some exemplary embodiments. For convenience of explanation, the description will be focused on the differences relative to FIG. 2.

Referring to FIG. 8, in a semiconductor device according to some exemplary embodiments, the second sidewall 63 of the isolating trench may include a first portion 63a and a second portion 63b.

The first portion 63a of the second sidewall of the isolating trench may be a portion having an acute angle with respect to the bottom surface 61 of the isolating trench 60. The second portion 63b of the second sidewall of the isolating trench may be a portion having an obtuse angle with respect to the bottom surface 61 of the isolating trench 60. That is, the second sidewall 63 of the isolating trench may include an obtuse angle portion 63b and an acute angle portion 63a with respect to the bottom surface 61 of the isolating trench.

The second sidewall 63 of the isolating trench may be formed, e.g., by two etching processes. That is, the process of forming the first portion 63a of the second sidewall 63 of the isolating trench 60, and the process of forming the second portion 63b of the second sidewall 63 of the isolating trench 60 may be different etch processes.

For example, the first portion 63a of the second sidewall 63 of the isolating trench 60 may be defined by the buried insulating film 55, e.g., the first portion 63a of the second sidewall 63 may be only within the buried insulating film 55. The second portion 63b of the second sidewall 63 of the isolating trench 60 may defined by the buried insulating film 55 and the second semiconductor substrate pattern 210, e.g., the second portion 63b of the second sidewall 63 may extend within the buried insulating film 55 and the second semiconductor substrate pattern 210.

Referring to FIG. 8, the first surface 210a of the second semiconductor substrate pattern 210, and at least a portion of the second sidewall 63 of the isolating trench 60 defined by the second semiconductor substrate pattern 210 may form an acute angle. That is, the first surface 210a of the second semiconductor substrate pattern 210 and the second portion 63b of the second sidewall 63 of the isolating trench 60 defined by the second semiconductor substrate pattern 210 may form an acute angle.

Figure 9:
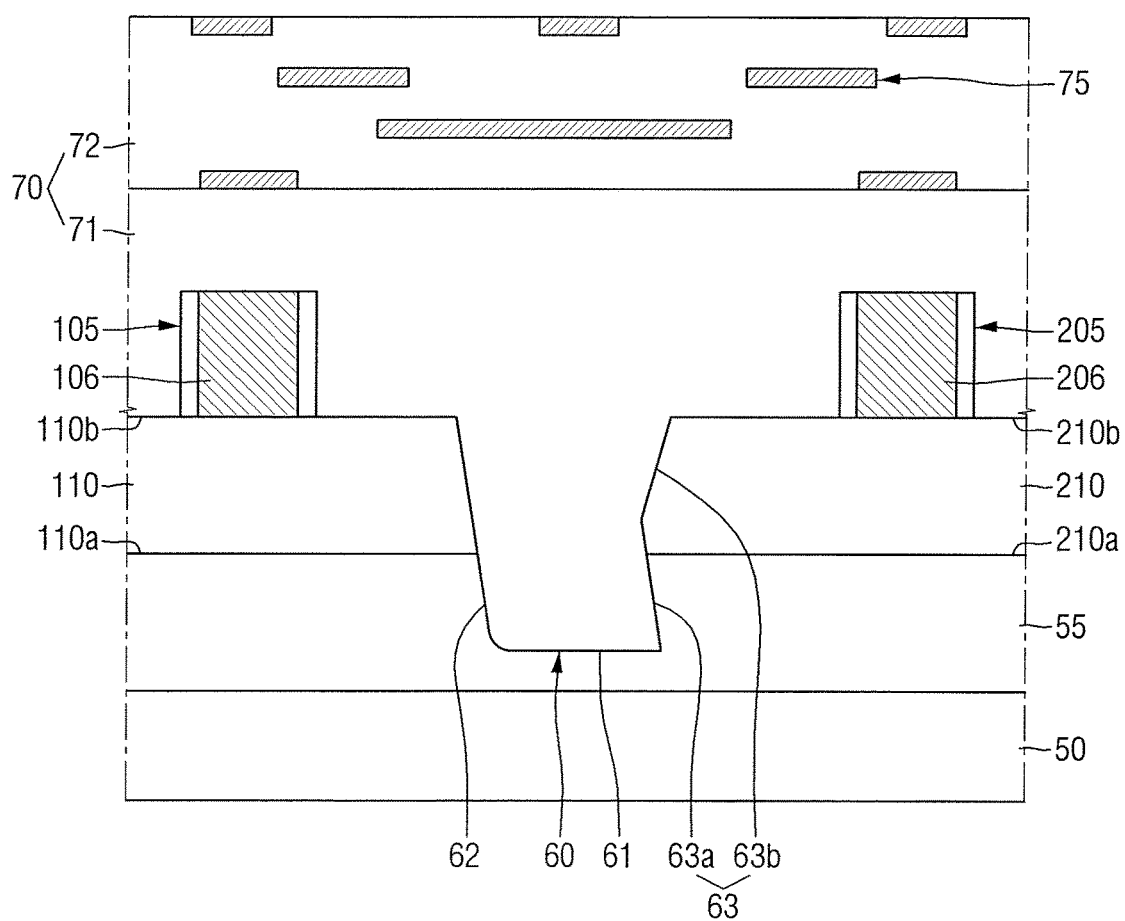
Figure 10:
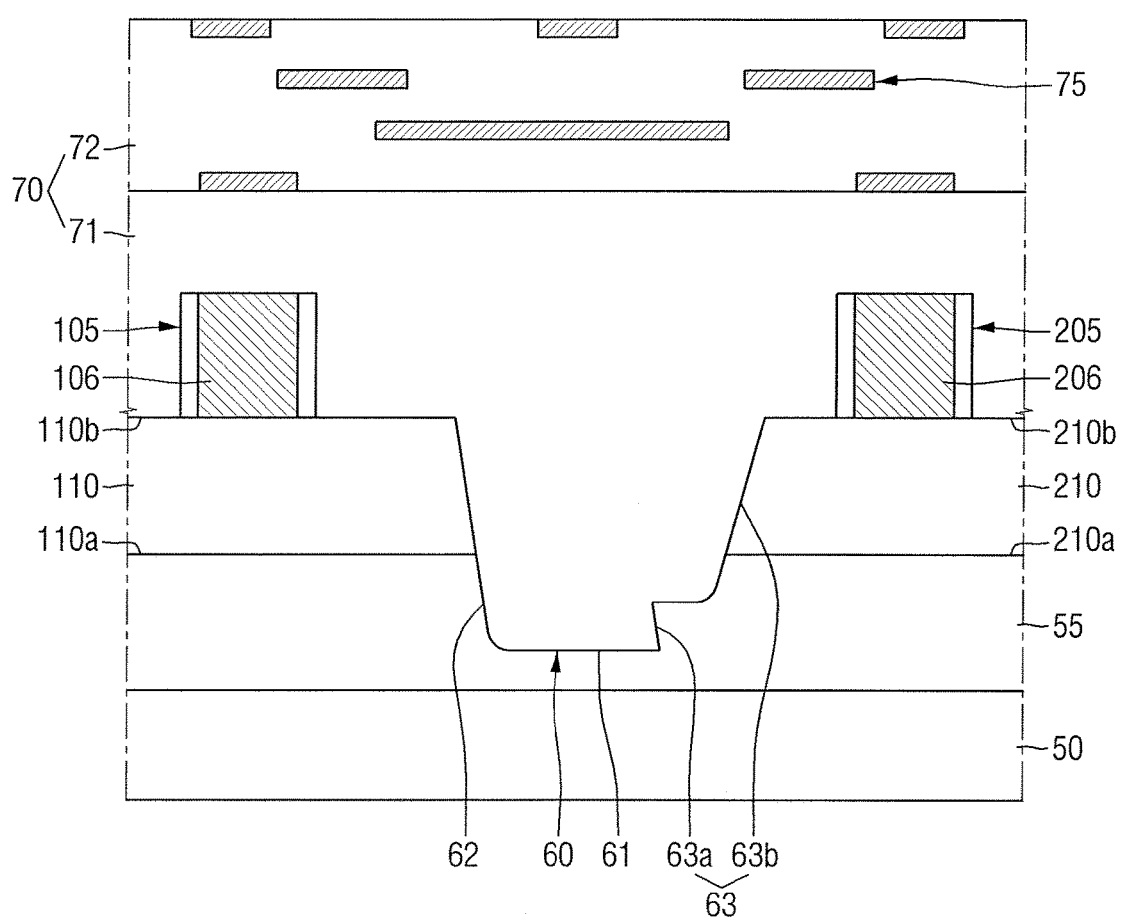
Figure 11:
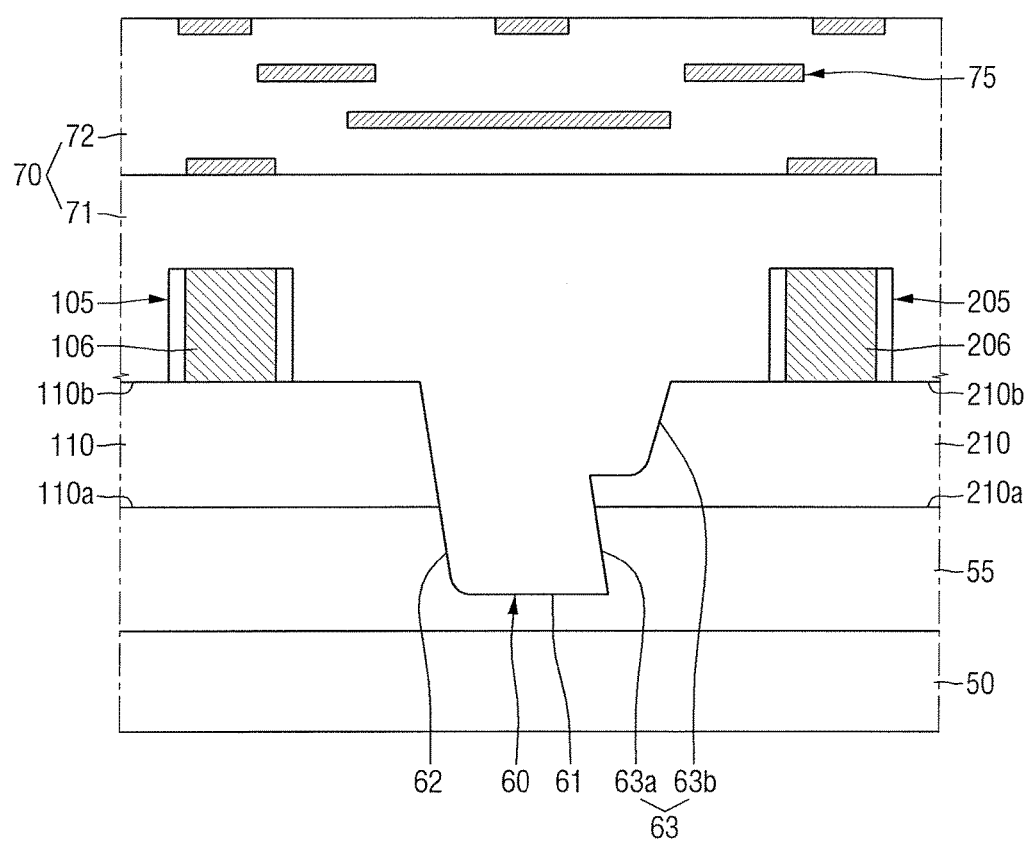

FIGS. 9 to 11 are cross-sectional views along line I-I of FIG. 1 according to some exemplary embodiments. For convenience of explanation, the description will be focused on the differences relative to FIG. 8.

Referring to FIG. 9, in a semiconductor device according to some exemplary embodiments, the first portion 63a of the second sidewall of the isolating trench may be defined by the buried insulating film 55 and the second semiconductor substrate pattern 210, e.g., the first portion 63a may extend within the buried insulating film 55 and continue along the second semiconductor substrate pattern 210. The second portion 63b of the second sidewall of the isolating trench may be defined, e.g., only, by the second semiconductor substrate pattern 210.

The first surface 210a of the second semiconductor substrate pattern 210 and at least a portion of the second sidewall 63 of the isolating trench 60 defined by the second semiconductor substrate pattern 210 may form an obtuse angle. The first surface 210a of the second semiconductor substrate pattern 210 and the first portion 63a of the second sidewall 63 of the isolating trench 60 defined by the second semiconductor substrate pattern 210 may form an obtuse angle.

Referring to FIG. 10, in a semiconductor device according to some exemplary embodiments, the second sidewall 63 of the isolating trench 60 may have a connection that connects a first portion 63a of the second sidewall of the isolating trench to a second portion 63b of the second sidewall of the isolating trench.

The connection of the second sidewall 63 of the isolating trench 60 may be a portion extending in a direction parallel to the base substrate 50. The connection of the second sidewall 63 of the isolating trench may be defined by the buried insulating film 55.

The connecting portion between the second portion 63b of the second sidewall 63 of the isolating trench 60 and the connection of the second sidewall 63 of the isolating trench 60 may be rounded. However, the connecting portion between the first portion 63a of the second sidewall 63 of the isolating trench 60 and the connection of the second sidewall 63 of the isolating trench 60 may not be rounded.

The first surface 210a of the second semiconductor substrate pattern 210 and at least a portion of the second sidewall 63 of the isolating trench 60 defined by the second semiconductor substrate pattern 210 may form an acute angle. The first surface 210a of the second semiconductor substrate pattern 210 and the second portion 63b of the second sidewall 63 of the isolating trench 60 defined by the second semiconductor substrate pattern 210 may form an acute angle.

Referring to FIG. 11, in a semiconductor device according to some exemplary embodiments, the second sidewall 63 of the isolating trench 60 may have a connection that connects a first portion 63a of the second sidewall of the isolating trench to a second portion 63b of the second sidewall of the isolating trench.

The first portion 63a of the second sidewall 63 of the isolating trench 60 may be defined by the buried insulating film 55 and the second semiconductor substrate pattern 210. The second portion 63b of the second sidewall 64 of the isolating trench 60 may be defined by the second semiconductor substrate pattern 210.

The connection of the second sidewall 63 of the isolating trench 60 may be a portion extending in a direction parallel to the first surface 210a of the second semiconductor substrate pattern 210. The connection of the second sidewall 63 of the isolating trench 60 may be defined by the second semiconductor substrate pattern 210.

The connecting portion between the second portion 63b of the second sidewall 63 of the isolating trench 60 and the connection of the second sidewall 63 of the isolating trench 60 may be rounded. However, the connecting portion between the first portion 63a of the second sidewall 63 of the isolating trench 60 and the connection of the second sidewall 63 of the isolating trench 60 may not be rounded.

The first surface 210a of the second semiconductor substrate pattern 210 and at least a portion of the second sidewall 63 of the isolating trench 60 defined by the second semiconductor substrate pattern 210 may form an obtuse angle. The first surface 210a of the second semiconductor substrate pattern 210 and the first portion 63a of the second sidewall 63 of the isolating trench 60 defined by the second semiconductor substrate pattern 210 may form an obtuse angle.

Figure 12:
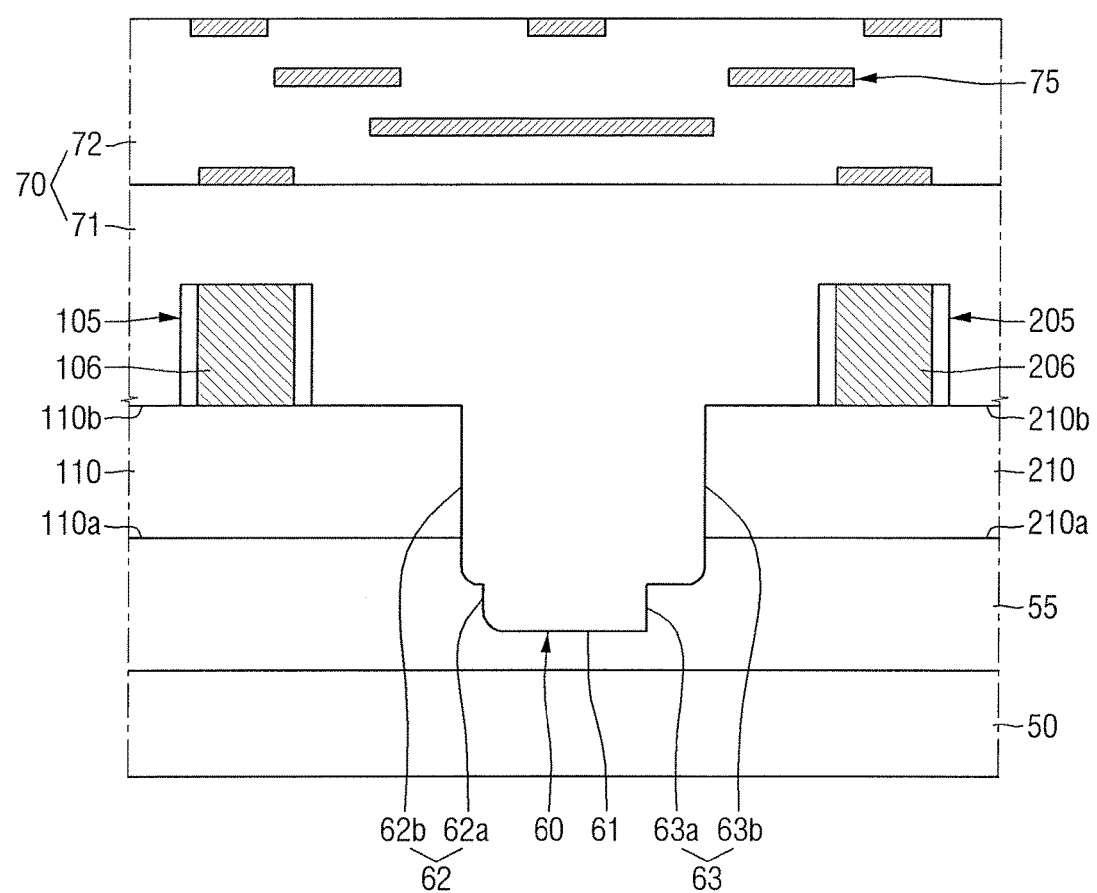

FIG. 12 is a cross-sectional view along line I-I of FIG. 1 according to some exemplary embodiments. For convenience of explanation, differences relative to FIG. 5 will be mainly explained below.

Referring to FIG. 12, in a semiconductor device according to some exemplary embodiments, the first sidewall 62 of the isolating trench 60 may include a first portion 62a and a second portion 62b. The second sidewall 63 of the isolating trench may include a first portion 63a and a second portion 63b.

The first sidewall 62 of the isolating trench 60 may include a connection that connects the first portion 62a of the first sidewall 62 of the isolating trench 60 to the second portion 62b of the first sidewall 62 of the isolating trench 60. The second sidewall 63 of the isolating trench 60 may include a connection that connects the first portion 63a of the second sidewall 63 of the isolating trench 60 and the second portion 63b of the second sidewall 63 of the isolating trench 60.

As illustrated in FIG. 12, the connection of the first sidewall 62 of the isolating trench 60 and the connection of the second sidewall 63 of the isolating trench 60 may be defined by the buried insulating film 55, although exemplary embodiments are not limited thereto.

Unlike the illustration in FIG. 12, only one of the first sidewall 62 of the isolating trench 60 and the second sidewall 63 of the isolating trench 60 may include a connection.

Figure 13:
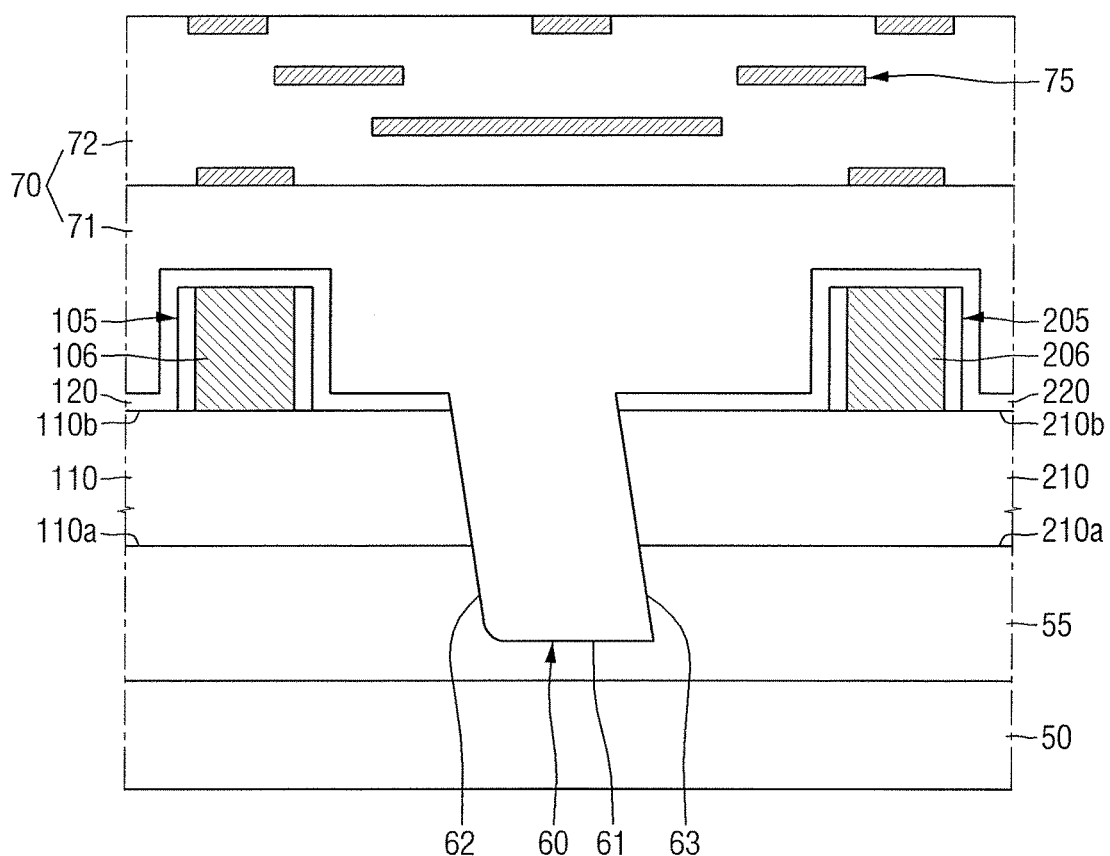
Figure 14:
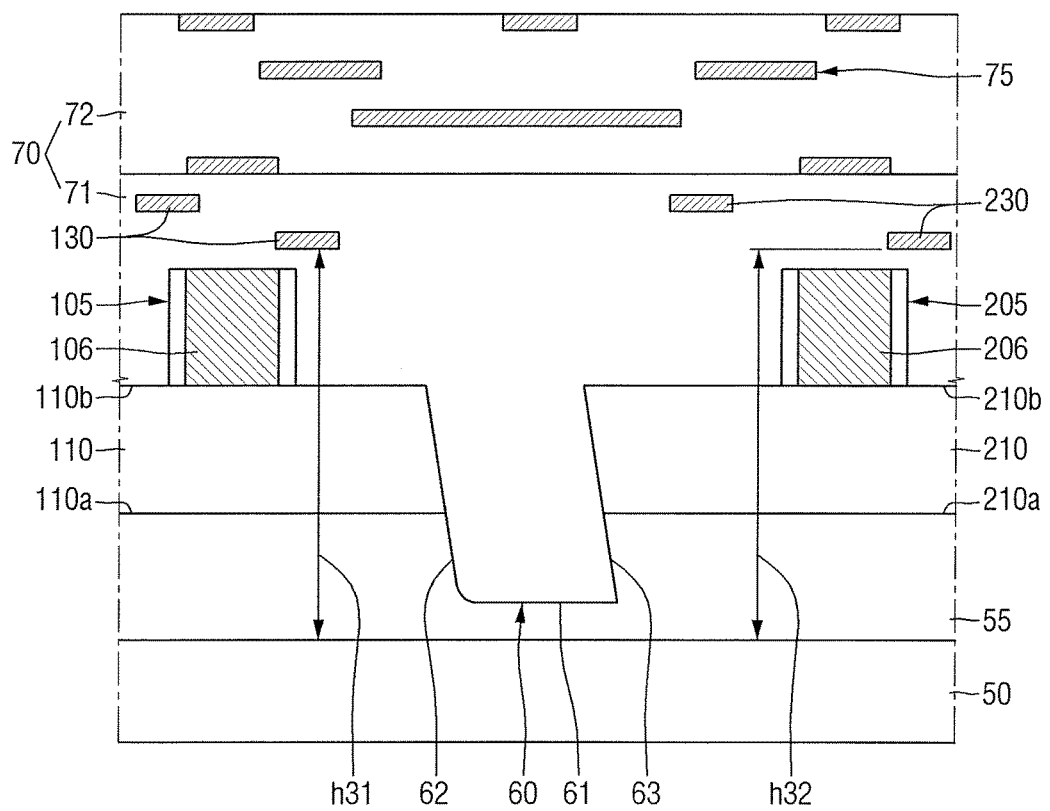
Figure 15:
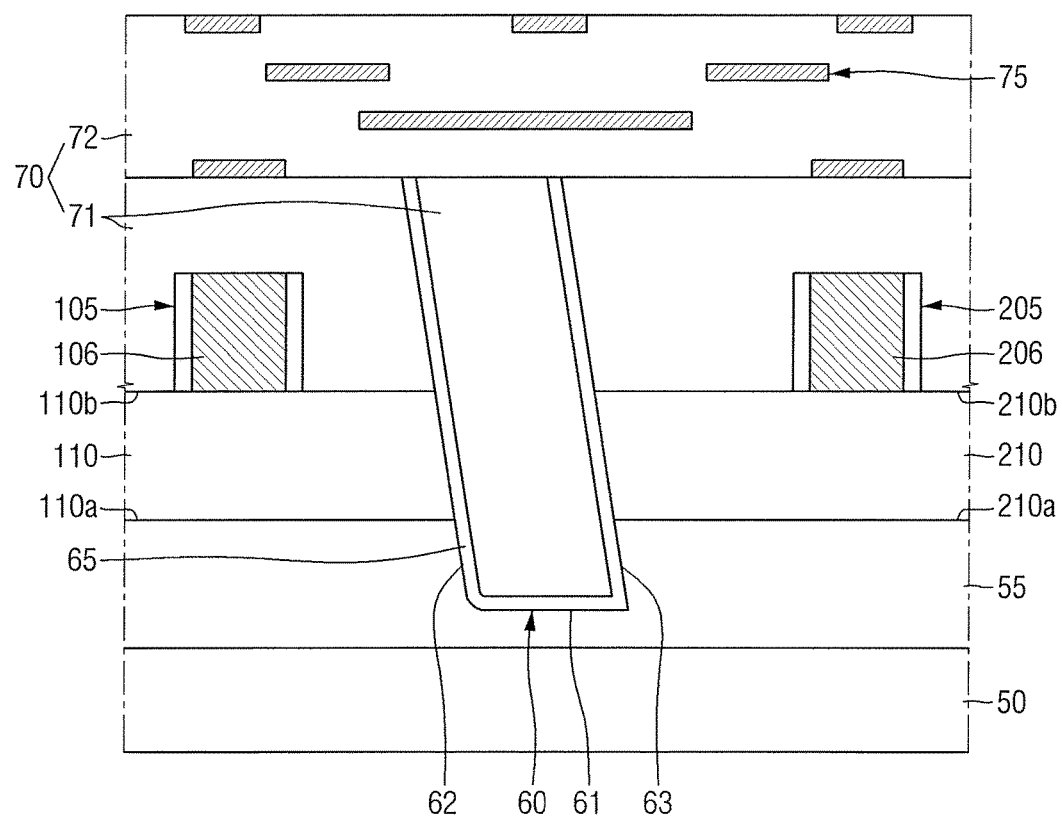

FIGS. 13 to 15 are cross-sectional views along line I-I of FIG. 1 according to some exemplary embodiments. For convenience of explanation, the description will be focused on the differences relative to FIGS. 1 and 2.

Referring to FIG. 13, a semiconductor device according to some exemplary embodiments may further include a first etch stop layer 120 and a second etch stop layer 220.

The first etch stop layer 120 may extend along at least a portion of the first device pattern 105 on the first semiconductor substrate pattern 110. The first etch stop layer 120 may also be formed on the second surface 110b of the first semiconductor substrate pattern.

The second etch stop layer 220 may extend along at least a portion of the second device pattern 205 on the second semiconductor substrate pattern 210. The second etch stop layer 220 may also be formed on the second surface 210b of the second semiconductor substrate pattern.

The first etch stop layer 120 and the second etch stop layer 220 are spaced apart from each other. The isolating trench 60 may be formed, with the first etch stop layer 120 and the second etch stop layer 220 being interposed therebetween. That is, the isolating trench 60 may be disposed between one end of the first etch stop layer 120 and one end of the second etch stop layer 220.

The first lower interlayer insulating film 71 on the first semiconductor substrate pattern 110 may be formed on the first etch stop layer 120. The first lower interlayer insulating film 71 on the second semiconductor substrate pattern 210 may be formed on the second etch stop layer 220.

The first etch stop layer 120 and the second etch stop layer 220 may include a material having an etch selectivity with respect to the first lower interlayer insulating film 71. The first etch stop layer 120 and the second etch stop layer 220 may each include, but are not limited to, e.g., silicon nitride, silicon oxynitride, silicon carbide nitride, and combinations thereof.

Referring to FIG. 13, the first etch stop layer 120 and the second etch stop layer 220 are shown as not extending along the sidewalls 62 and 63 of the isolating trench and the bottom surface 61 of the isolating trench, respectively, although exemplary embodiments are not limited thereto. That is, depending on when the first etch stop layer 120 and the second etch stop layer 220 are formed during the fabricating process, portions of the first etch stop layer 120 and/or the second etch stop layer 220 may be formed on the first and second sidewalls 62 and 63 of the isolating trench 60 and on the bottom surface 61 of the isolating trench 60.

Referring to FIG. 14, the semiconductor device according to some exemplary embodiments may include a first interconnect wire 130, e.g., a wire structure, and a second interconnect wire 230.

The first interconnect wire 130 may be formed within the first lower interlayer insulating film 71 overlapping the first semiconductor substrate pattern 110. The first interconnect wire 130 may be electrically connected to the first device pattern 105. The first interconnect wire 130 may not include a portion overlapping the isolating trench 60.

The second interconnect wire 230 may be formed within the first lower interlayer insulating film 71 overlapping the first semiconductor substrate pattern 210. The second interconnect wire 230 may be electrically connected to the second device pattern 205. The second interconnect wire 230 may not include a portion overlapping the isolating trench 60.

The first interconnect wire 130 and the second interconnect wire 230 may be electrically connected through the first integration interconnect wire 75. That is, the first interconnect wire 130 and the second interconnect wire 230 may not be connected directly to each other but via the first integration interconnect wire 75.

As illustrated in FIG. 14, a height h31 from the base substrate 50 to a lowermost wire of the first interconnect wire 130 may be different from a height h32 from the base substrate 50 to a lowermost wire of the second interconnect wire 230, although exemplary embodiments are not limited thereto. Since the first interconnect wire 130 and the second interconnect wire 230 are formed through different fabricating processes, the level at which the first interconnect wire 130 is formed with respect to the base substrate 50 may be different from the level at which the second interconnect wire 230 is formed.

Referring to FIG. 15, a semiconductor device according to some exemplary embodiments may include an insulating liner 65 in the isolating trench 60.

The insulating liner 65 may be formed, e.g., conformally and continuously, along the first sidewall 62 of the isolating trench 60, the bottom surface 61 of the isolating trench 60, and the second sidewall 63 of the isolating trench 60. The insulating liner 65 may include a material having an etch selectivity with respect to the first lower interlayer insulating film 71. The insulating liner 65 may include, but is not limited to, e.g., silicon nitride, silicon oxynitride, and the like.

Since the insulating liner 65 may be formed before the first lower interlayer insulating film 71 filling the isolating trench 60 is formed, the insulating liner 65 may extend to the upper surface of the first lower interlayer insulating film 71, but is not limited thereto. In addition, the insulating liner 65 may not extend along the second surface 110b of the first semiconductor substrate pattern 110 and the second surface 210b of the second semiconductor substrate pattern 210. In the first lower interlayer insulating films 71, a portion of the first lower interlayer insulating film 71 filling the isolating trench 60 may be formed on the insulating liner 65.

Figure 16:
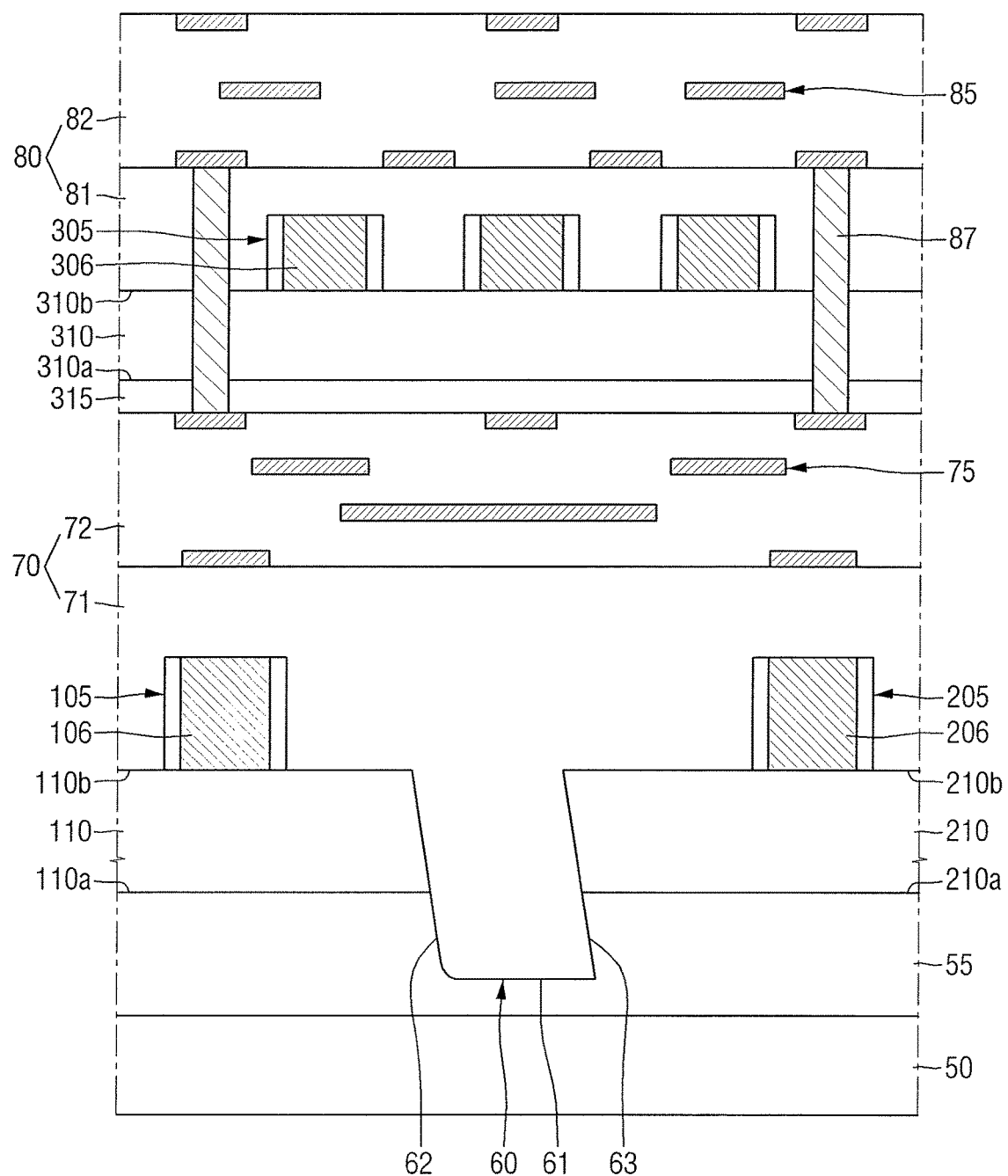
Figure 17:
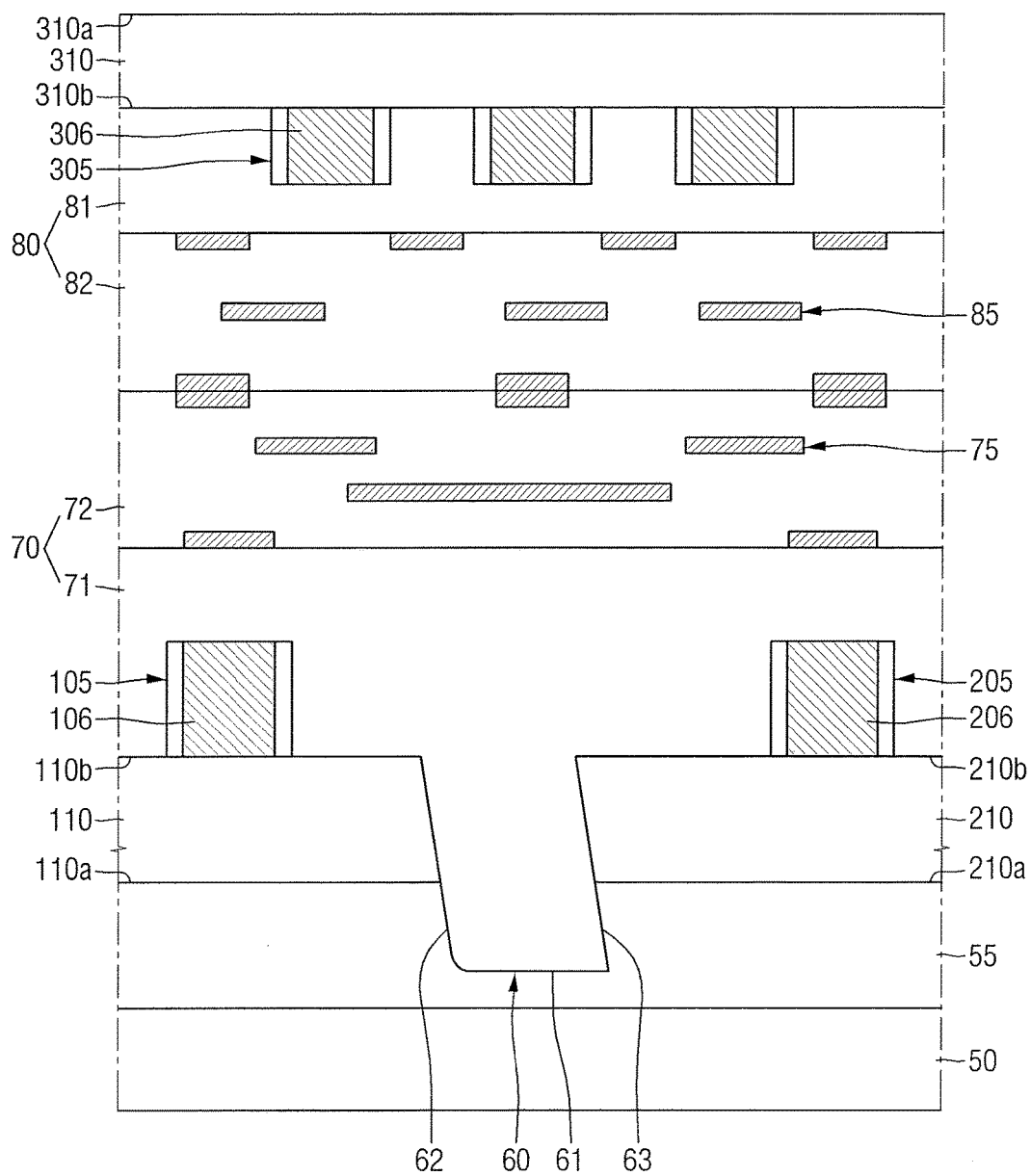

FIGS. 16 and 17 are cross-sectional views along line I-I of FIG. 1 according to some exemplary embodiments of the present disclosure. For convenience of explanation, the description will be focused on the differences relative to FIG. 2.

Referring to FIG. 16, a semiconductor device according to some exemplary embodiments may further include a third semiconductor substrate pattern 310, a first insertion buried insulating film 315, a third device pattern 305, and a second integration interconnect wire 85.

The first insertion buried insulating film 315 may be disposed on the first interlayer insulating film 70. The first insertion buried insulating film 315 may, e.g., include silicon oxide, but is not limited thereto.

The third semiconductor substrate pattern 310 may be formed on the first insertion buried insulating film 315. The third semiconductor substrate pattern 310 may be in contact with the first insertion buried insulating film 315. The third semiconductor substrate pattern 310 may include a first surface 310a and a second surface 310b facing each other. The first surface 310a of the third semiconductor substrate pattern 310 may face the first insertion buried insulating film 315 and the first interlayer insulating film 70. That is, the first surface 310a of the third semiconductor substrate pattern 310 may be in contact with the first buried insulating film 55. The third semiconductor substrate pattern 310 may include, e.g., silicon or germanium, which is an elemental semiconductor material, or may include a Group IV-IV compound semiconductor or a Group III-V compound semiconductor.

The third device pattern 305 may be formed on the third semiconductor substrate pattern 310. The third device pattern 305 may be formed on the second surface 310b of the third semiconductor substrate pattern. The third device pattern 305 may include a third gate electrode 306. For example, the third device pattern 305 may include a third transistor. The third device pattern 305 may include the third gate electrode 306, a source/drain region of the third transistor, and a channel region of the third transistor between the source/drain region.

Referring to FIG. 16, the shape of the third device pattern 305, i.e., the shape of the third transistor, is shown briefly, but is not limited thereto. The shape of the third device pattern 305 may be different from the shape of the first device pattern 105 and/or the shape of the second device pattern 205. Alternatively, the material of the channel region of the third transistor may be different from the material of the channel region of the first transistor and/or the channel region of the second transistor.

Referring to FIG. 16, the third semiconductor substrate pattern 310 is illustrated as being formed across the first semiconductor substrate pattern 110 and the second semiconductor substrate pattern 210, but is not limited thereto. The third semiconductor substrate pattern 310 and the third device pattern 305 may be sequentially formed on the first interlayer insulating film 70.

A second interlayer insulating film 80 may be formed on the third semiconductor substrate pattern 310. The second interlayer insulating film 80 may include a second lower interlayer insulating film 81 and a second upper interlayer insulating film 82. The second lower interlayer insulating film 81 may overlie the third device pattern 305. The second upper interlayer insulating film 82 may be formed on the second lower interlayer insulating film 81.

A second integration interconnect wire 85 may be formed within the second upper interlayer insulating film 82. The second integration interconnect wire 85 may be electrically connected to the third device pattern 305. The second integration interconnect wire 85 may be electrically connected to the first integration interconnect wire 75 by a through-electrode 87. The through-electrode 87 may be formed through the first insertion buried insulating film 315, the third semiconductor substrate pattern 310, and the second lower interlayer insulating film 81, but is not limited thereto. Accordingly, the third device pattern 305 may be electrically connected to the first device pattern 105 and/or the second device pattern 205 by the through-electrode 87.

Referring to FIG. 17, a semiconductor device according to some exemplary embodiments may further include a third semiconductor substrate pattern 310, a third device pattern 305, and a second integration interconnect wire 85.

The third semiconductor substrate pattern 310 may be formed on the first interlayer insulating film 70. The third semiconductor substrate pattern 310 may include a first surface 310a and a second surface 310b facing each other. The second surface 310b of the third semiconductor substrate pattern 310 may face the first interlayer insulating film 70. The third semiconductor substrate pattern 310 may include, e.g., silicon or germanium, which is an elemental semiconductor material, or may include a Group IV-IV compound semiconductor or a Group III-V compound semiconductor.

The third device pattern 310 may be formed on the second surface 310b of the third semiconductor substrate pattern 305. The third device pattern 305 may include a third gate electrode 306. The third device pattern 305 may include a third transistor. Referring to FIG. 17, the third device pattern 305 may be disposed between the third semiconductor substrate pattern 310 and the first interlayer insulating film 70.

The second interlayer insulating film 80 may be formed on the second surface 310b of the third semiconductor substrate pattern 310. The second interlayer insulating film 80 may be disposed between the third semiconductor substrate pattern 310 and the first interlayer insulating film 70.

The second interlayer insulating film 80 may include a second lower interlayer insulating film 81 and a second upper interlayer insulating film 82. The second lower interlayer insulating film 81 may overlie the third device pattern 305. The second upper interlayer insulating film 82 may be formed between the second lower interlayer insulating film 81 and the first interlayer insulating film 70.

The second integration interconnect wire 85 may be formed within the second upper interlayer insulating film 82. The second integration interconnect wire 85 may be electrically connected to the third device pattern 305. The second integration interconnect wire 85 may be connected to the first integration interconnect wire 75. For example, the second integration interconnect wire 85 may be directly connected to the first integration interconnect wire 75, but is not limited thereto.

Figure 18:
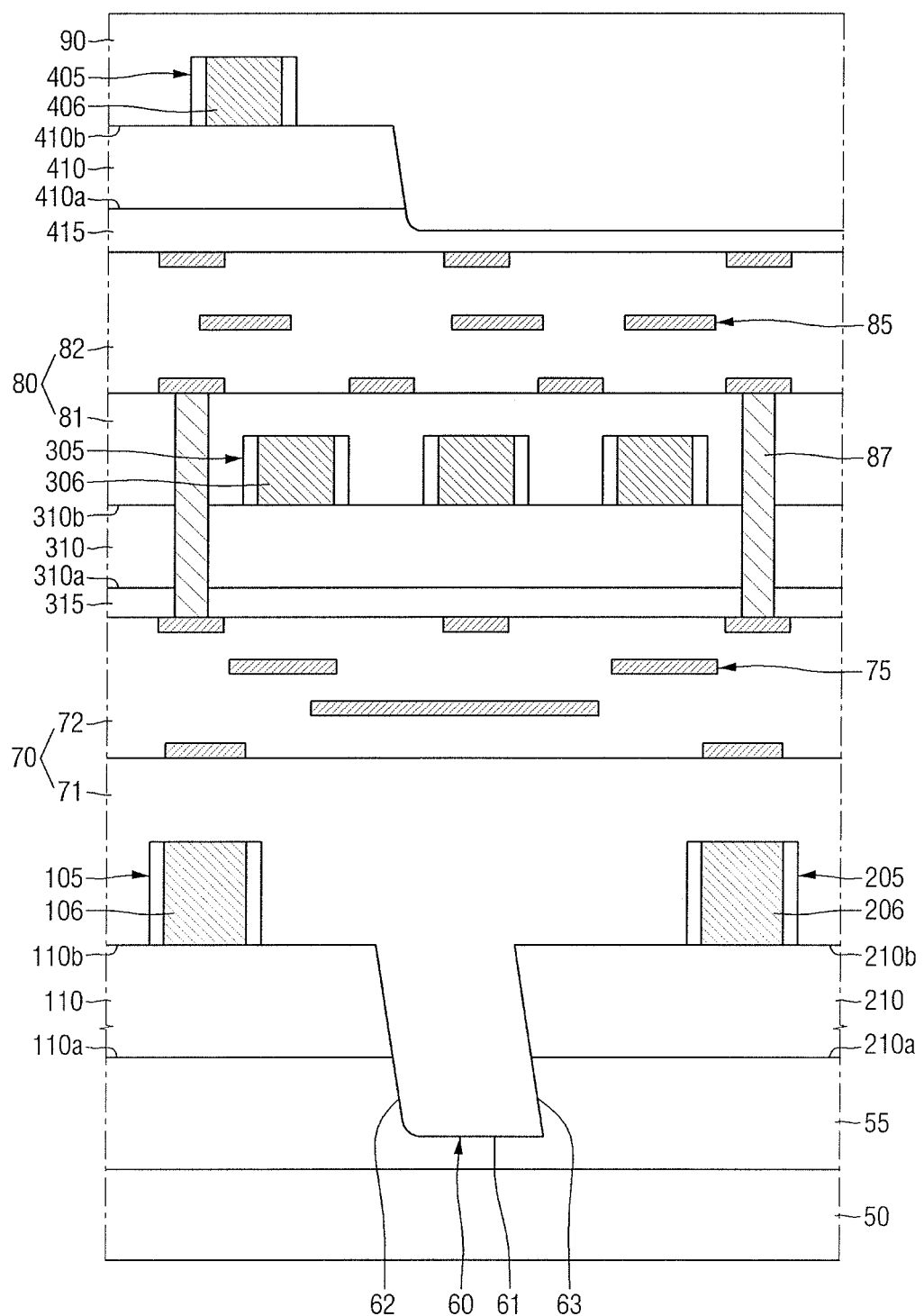

FIG. 18 is a cross-sectional view along line I-I of FIG. 1 according to some exemplary embodiments. For convenience of explanation, the description will be focused on the differences relative to FIG. 16.

Referring to FIG. 18, a semiconductor device according to some exemplary embodiments may further include a fourth semiconductor substrate pattern 410, a second insertion buried insulating film 415, and a fourth device pattern 405.

The second insertion buried insulating film 415 may be disposed on the second interlayer insulating film 80. The second insertion buried insulating film 415 may, e.g., include silicon oxide, but not limited thereto.

The fourth semiconductor substrate pattern 410 may be formed on the second insertion buried insulating film 415. The fourth semiconductor substrate pattern 410 may be in contact with the second insertion buried insulating film 415. The fourth semiconductor substrate pattern 410 may include a first surface 410a and a second surface 410b facing each other. The first surface 410a of the fourth semiconductor substrate pattern 410 may face the second insertion buried insulating film 415 and the second interlayer insulating film 80. The first surface 410a of the fourth semiconductor substrate pattern 410 may be in contact with the second buried insulating film 55.

The fourth semiconductor substrate pattern 410 may include, e.g., silicon or germanium, which is an elemental semiconductor material, or may include a Group IV-IV compound semiconductor or a Group III-V compound semiconductor.

The fourth device pattern 405 may be formed on the fourth semiconductor substrate pattern 410. The fourth device pattern 405 may be formed on the second surface 410b of the fourth semiconductor substrate pattern. The fourth device pattern 405 may include a fourth gate electrode 406. For example, the fourth device pattern 405 may include a fourth transistor. In FIG. 18, the shape of the fourth device pattern 405, i.e., the shape of the fourth transistor, is shown briefly, but is not limited thereto.

As illustrated in FIG. 18, the fourth semiconductor substrate pattern 410 may be formed such that it overlaps the first semiconductor substrate pattern 110 and does not overlap the second semiconductor substrate pattern 210, although exemplary embodiments are not limited thereto.

A third interlayer insulating film 90 may be formed on the fourth semiconductor substrate pattern 410. The third interlayer insulating film 90 may overlie the fourth device pattern 405. Although not shown, a interconnect wire electrically connected to the fourth device pattern 405 may be formed within the third interlayer insulating film 90.

FIGS. 19 to 29 are cross-sectional views along line I-I of FIG. 1 illustrating intermediate stages in a method for fabricating a semiconductor device according to some exemplary embodiments.

Figure 19:
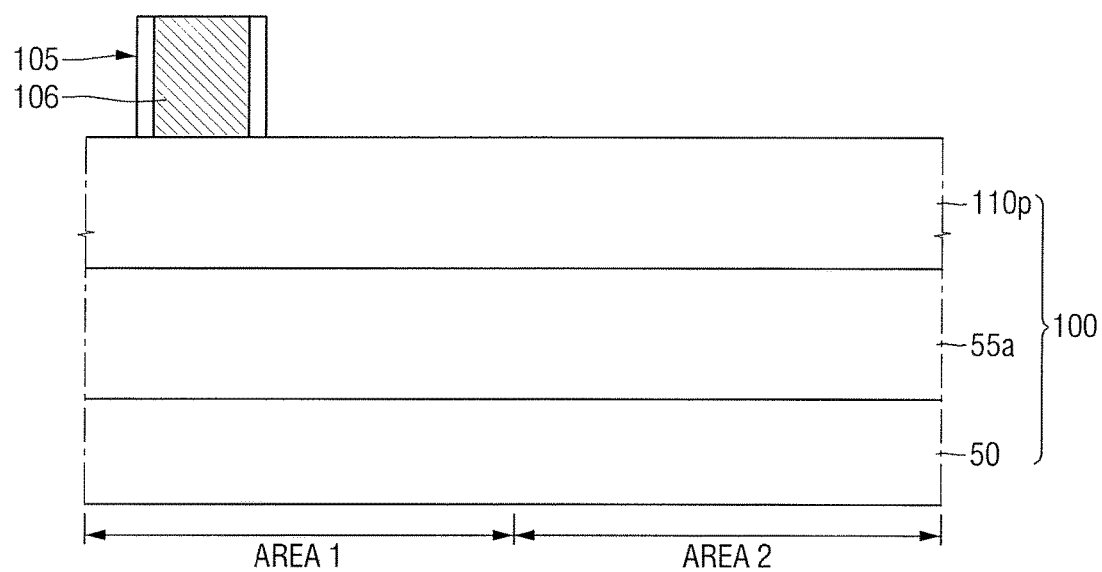
FIGS. 19 to 29 illustrate cross-sectional views of intermediate stages in a method for fabricating a semiconductor device according to some exemplary embodiments.

Referring to FIG. 19, a first substrate 100 including the first device region AREA 1 and the second device region AREA 2 may be provided. The first substrate 100 may include the base substrate 50, a pre-buried insulating film 55a, and a first semiconductor substrate 110p, which are stacked sequentially.

The first device pattern 105 including the first gate electrode 106 is formed on the first substrate 100 in the first device region AREA 1. The first device pattern 105 is formed on the first semiconductor substrate 110p.

Figure 20:
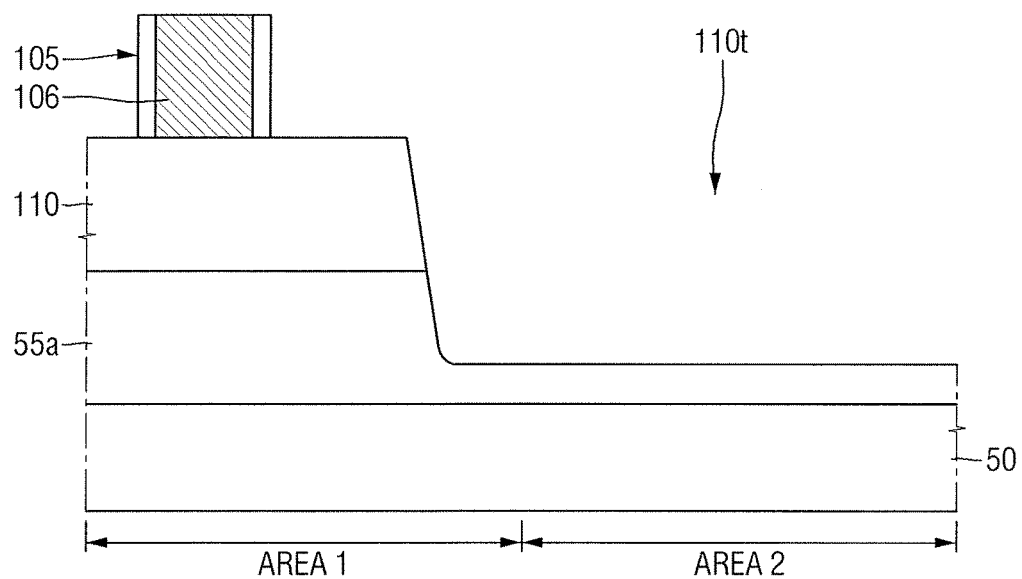

Referring to FIG. 20, a first substrate trench 110t may be formed by etching the first semiconductor substrate 110p in the second device region AREA 2, to expose the pre-buried insulating film 55a. Upon forming of the first substrate trench 110t, the first semiconductor substrate pattern 110 may be formed. Although it is illustrated that a portion of the pre-buried insulating film 55a is removed to form the first substrate trench 110t, the present disclosure is not limited thereto, e.g., a removed portion of the pre-buried insulating film 55a may be adjusted to provide any suitable shape of the isolating trench 60 discussed with respect to FIGS. 1-18.

Figure 21:
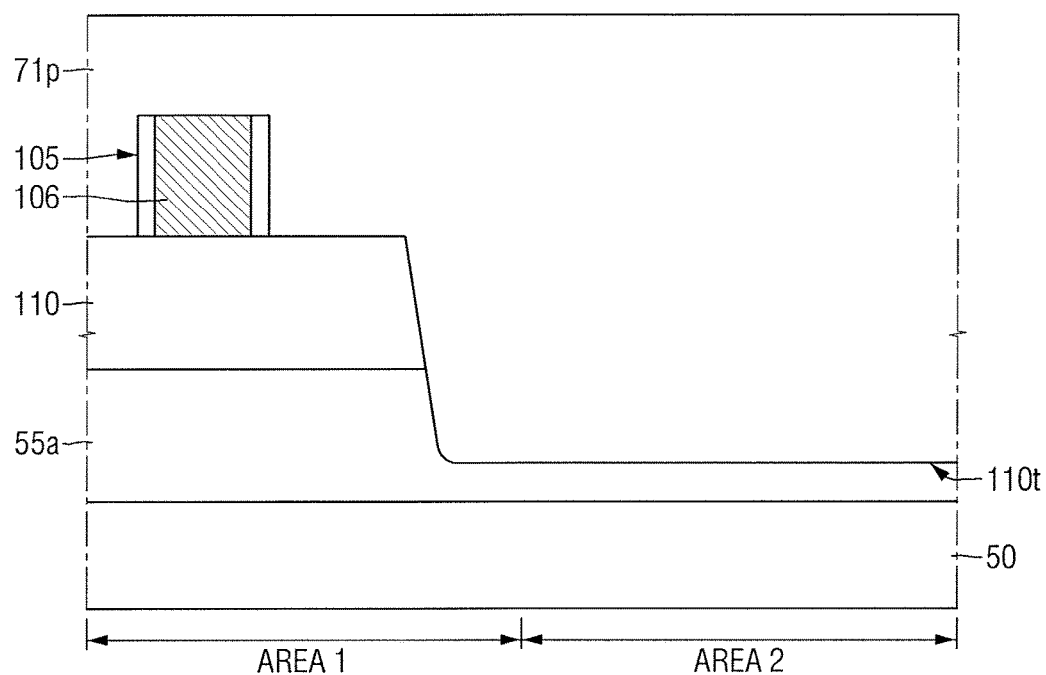

Referring to FIG. 21, a first pre-lower interlayer insulating film 71p overlying the first device pattern 105 may be formed on the first substrate 100. The first pre-lower interlayer insulating film 71p may fill the first substrate trench 110t.

Figure 22:
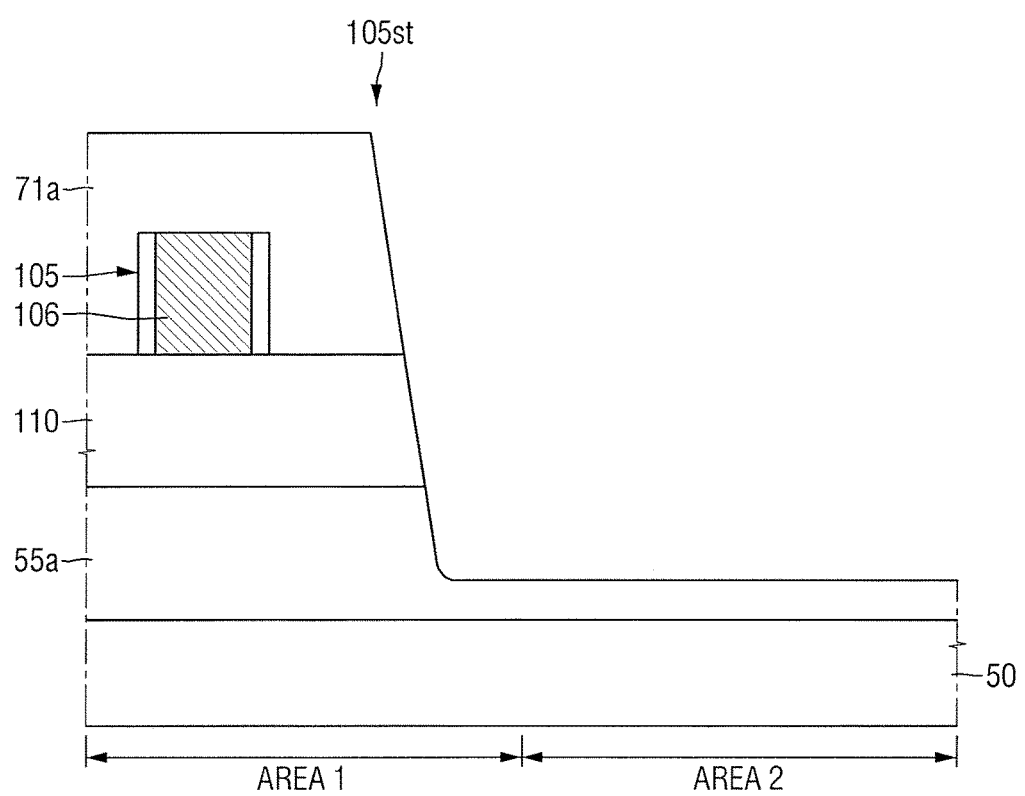

Referring FIG. 22, the first pre-lower interlayer insulating film 71p in the second device region AREA 2 may be etched, e.g., using an etching mask, to expose the pre-buried insulating film 55a in the second device region AREA 2.

The first pre-lower interlayer insulating film 71p in the second device region AREA 2 may be etched to form a first portion 71a of the first lower interlayer insulating film on the first device region AREA 1, e.g., with the first portion 71a completely covering exposed surfaces of the first device pattern 105. As a result, a first device substrate structure 105st may be formed. The profile of the sidewall of the first device substrate structure 105st may vary depending on the size of the region where the first pre-lower interlayer insulating film 71p in the second device region AREA 2 is removed.

Figure 23:
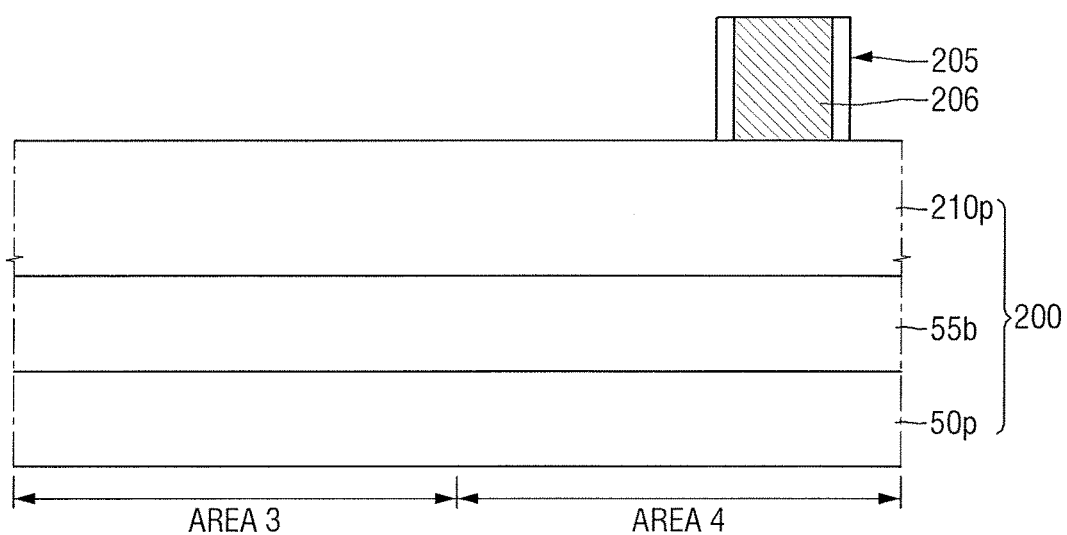

Referring to FIG. 23, a second substrate 200 including a third device region AREA 3 and a fourth device region AREA 4 is provided. The second substrate 200 may include a dummy base substrate 50p, a dummy buried insulating film 55b, and a second semiconductor substrate 210p, which are stacked sequentially.

The third device region AREA 3 may correspond to the first device region AREA 1 of the first substrate 100, and the fourth device region AREA 4 may correspond to the second device region AREA 2 of the first substrate 100.

The second device pattern 205 including the second gate electrode 206 is formed on the second substrate 200 in the fourth device region AREA 4. The second device pattern 205 is formed on the second semiconductor substrate 210p.

Figure 24:
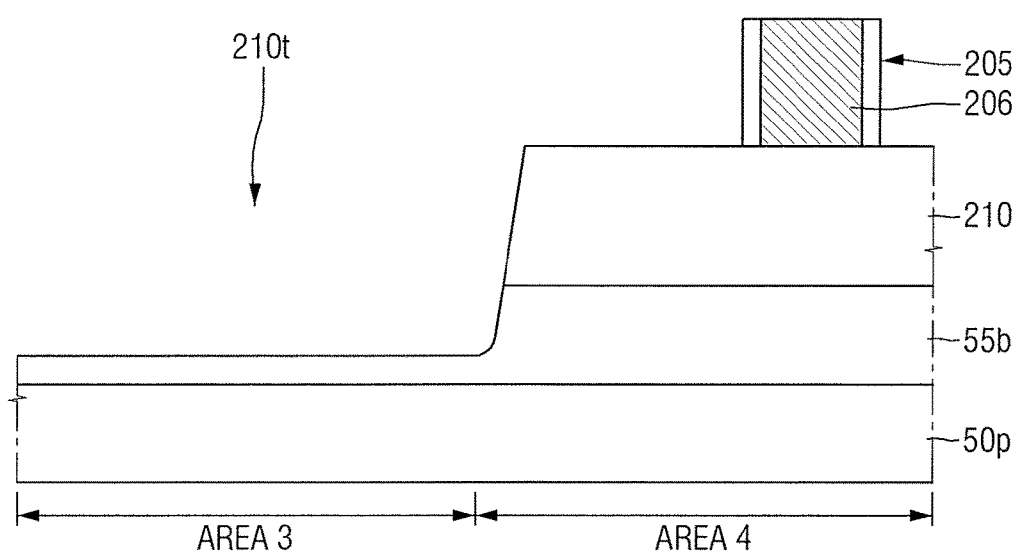

Referring to FIG. 24, a portion of the second substrate 200 of the third device region AREA 3 may be etched to form a second substrate trench 210t for exposing the dummy buried insulating film 55b. For example, the second semiconductor substrate 210p of the third device region AREA 3 may be etched to form a second substrate trench 210t for exposing the dummy buried insulating film 55b.

Upon forming of the second substrate trench 210t, the second semiconductor substrate pattern 210 may be formed. Although it is illustrated that a portion of the dummy buried insulating film 55b is removed to form the second substrate trench 210t, the present disclosure is not limited thereto.

Figure 25:
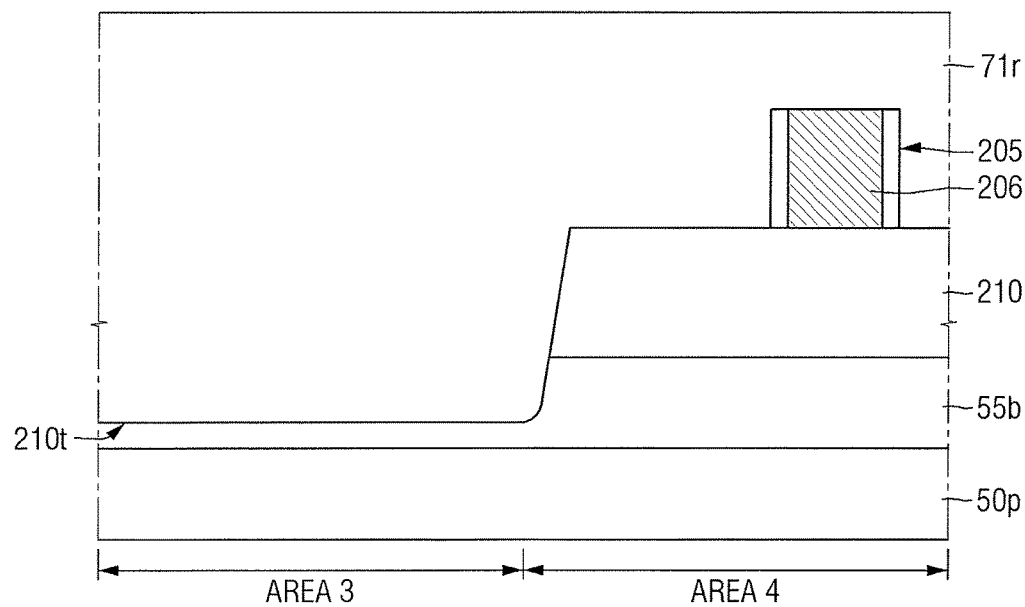

Referring to FIG. 25, a second pre-lower interlayer insulating film 71r overlying the second device pattern 205 may be formed on the second substrate 200. The second pre-lower interlayer insulating film 71r may fill the second substrate trench 210t.

Figure 26:
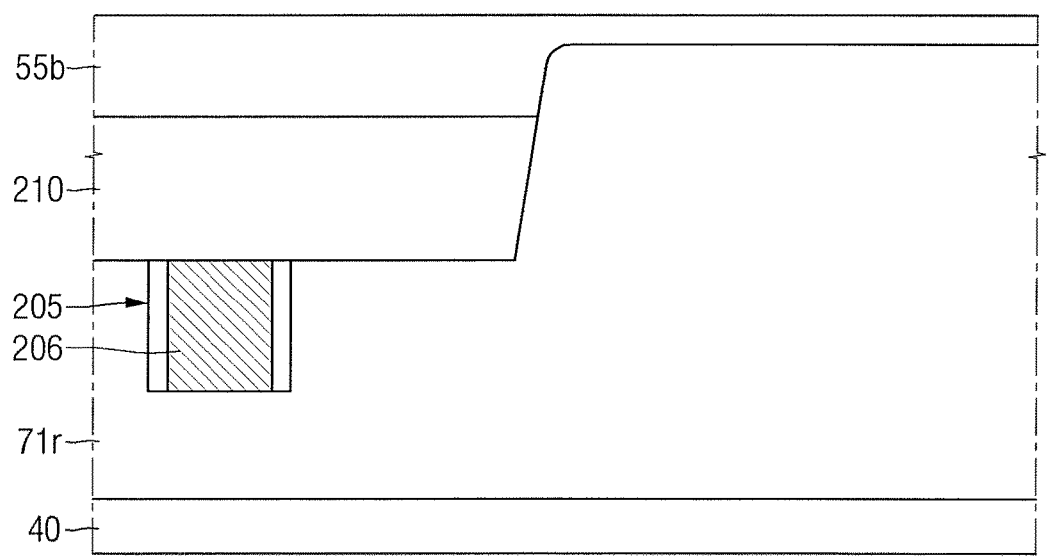

Referring to FIG. 26, the second pre-lower interlayer insulating film 71r may be bonded to a substrate supporter 40. Then, the dummy base substrate 50p may be removed to expose the dummy buried insulating film 55b. At this time, the thickness of the dummy buried insulating film 55b may be adjusted by partially removing the dummy buried insulating film 55b, but is not limited thereto.

Figure 27:
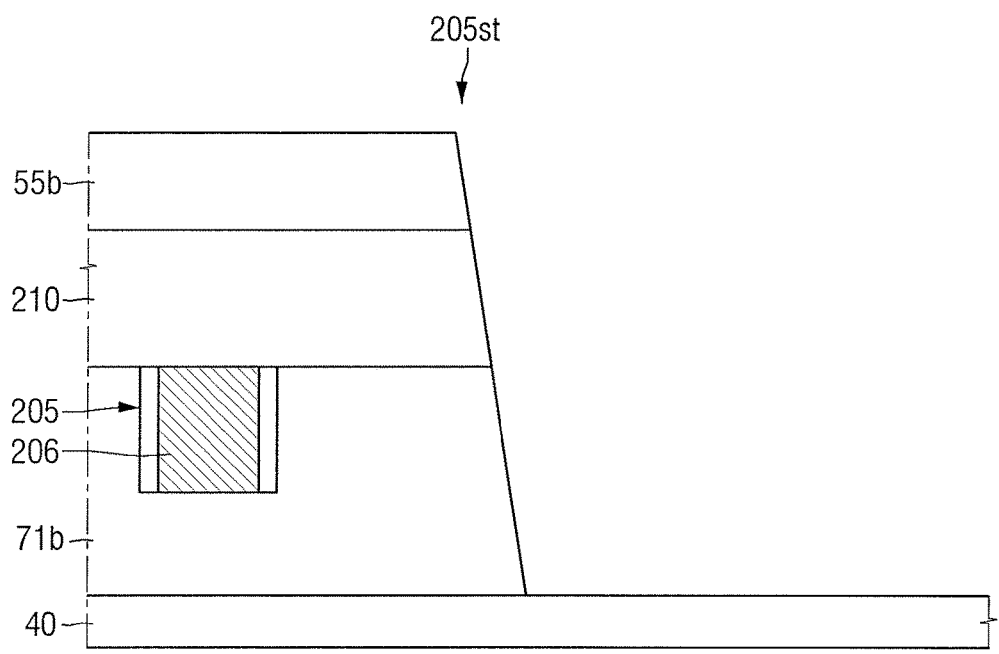

Referring to FIG. 27, at least a portion of the second substrate 200 and the second pre-lower interlayer insulating film 71r in the third device region AREA 3 (in FIG. 25) may be removed. That is, at least a portion of the dummy buried insulating film 55b in the third device region AREA 3 and the second pre-lower interlayer insulating film 71r may be removed to form a second portion 71b of the first lower interlayer insulating film on the fourth device region AREA 4. Thus, a second device substrate structure 205st may be formed on the substrate supporter 40.

Figure 28:
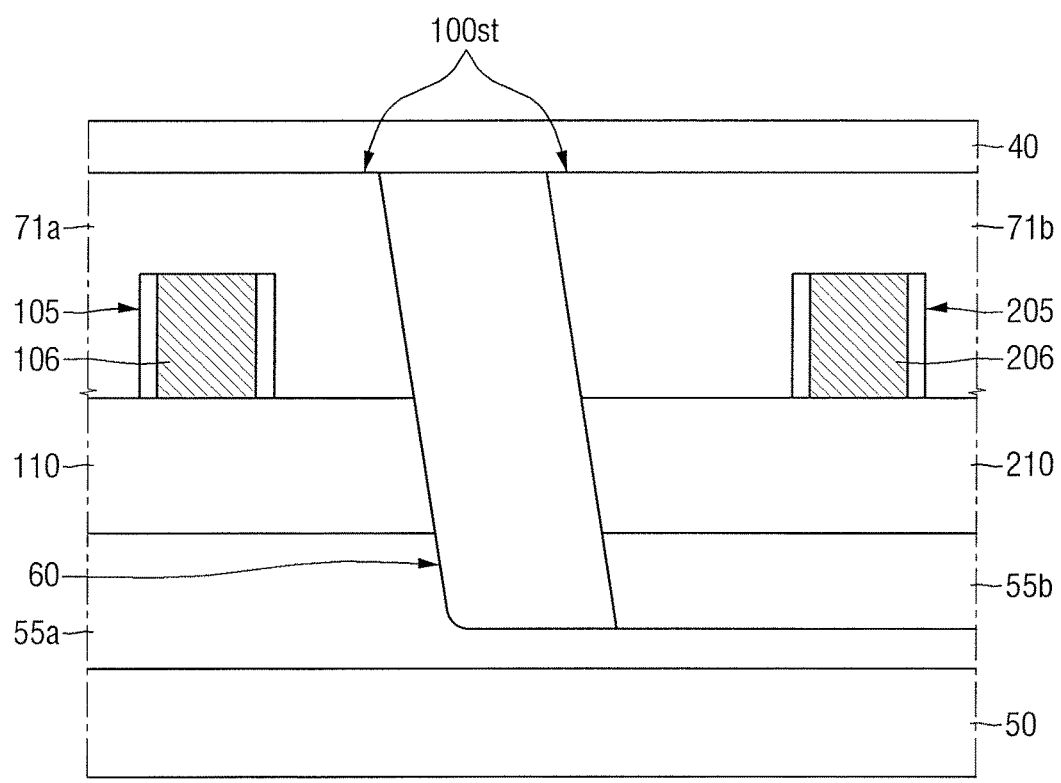

Referring to FIG. 28, a device junction substrate 100st may be formed by bonding the second device substrate structure 205st (in FIG. 27) to the first device substrate structure 105st (FIG. 22). The device junction substrate 100st may be formed by bonding the dummy buried insulating film 55b of the second device substrate structure 205st to the pre-buried insulating film 55a in the exposed second device region AREA 2, e.g., the dummy buried insulating film 55b and the pre-buried insulating film 55a may be formed of the same material.

As a result, the first semiconductor substrate pattern 110 and the first device pattern 105 may be located in the first device region AREA 1, and the second semiconductor substrate pattern 210 and the second device pattern 205 may be located in the second device region AREA 2. Further, the isolating trench 60 may be formed between the first semiconductor substrate pattern 110 and the second semiconductor substrate pattern 210 by bonding the second device substrate structure 205st to the first device substrate structure 105st.

Figure 29:
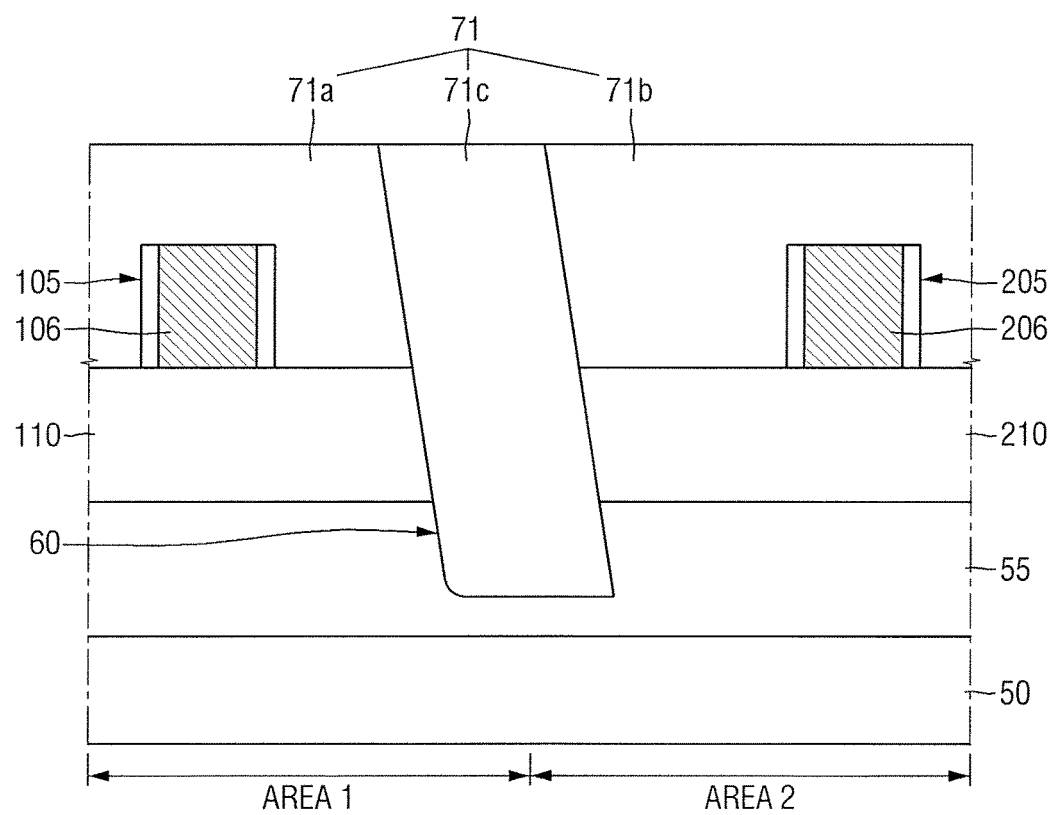

Referring to FIG. 29, the substrate supporter 40 may be removed. The bonded dummy buried insulating film 55b and the pre-buried insulating film 55a may define the buried insulating film 55.

Then, a filling interlayer insulating film 71c may be formed between the first portion 71a of the first lower interlayer insulating film and the second portion 71b of the first lower interlayer insulating film. The filling interlayer insulating film 71c may fill the isolating trench 60. The filling interlayer insulating film 71c may include an insulating material having an excellent gap-fill capability. As a result, the first lower interlayer insulating film 71 including the first portion 71a of the first lower interlayer insulating film, the second portion 71b of the first lower interlayer insulating film, and the filling interlayer insulating film 71c may be formed.

Referring to FIG. 2, the first integration interconnect wire 75 for electrically connecting the first device pattern 105 to the second device pattern 205 may be formed on the first lower interlayer insulating film 71.

Figure 30:
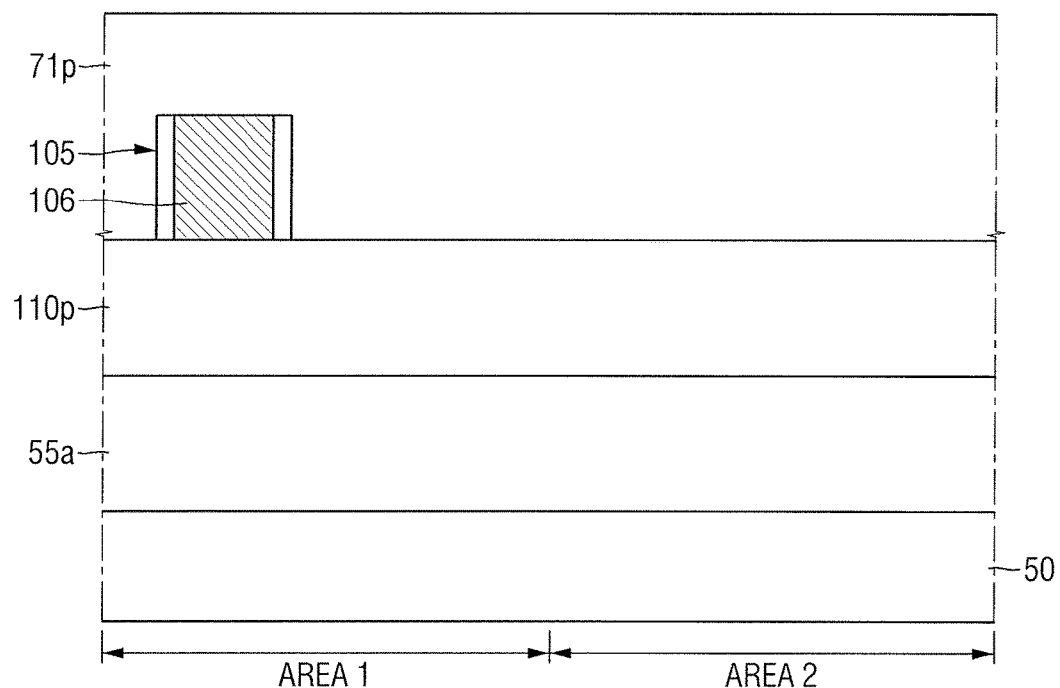
FIG. 30 illustrates a cross-sectional view of an intermediate stage in a method for fabricating a semiconductor device according to some exemplary embodiments.

FIG. 30 is a cross-sectional view along line I-I of FIG. 1 illustrating an intermediate stage in a method for fabricating a semiconductor device according to some exemplary embodiments.

Referring to FIG. 30, a first pre-lower interlayer insulating film 71p overlying the first device pattern 105 may be formed on the first semiconductor substrate 110p. Then, referring to FIG. 22, the first pre-lower interlayer insulating film 71p and the first semiconductor substrate 110p in the second device region AREA 2 may be etched to expose the pre-buried insulating film 55a. As a result, the first device substrate structure 105st may be formed.

Figure 31:
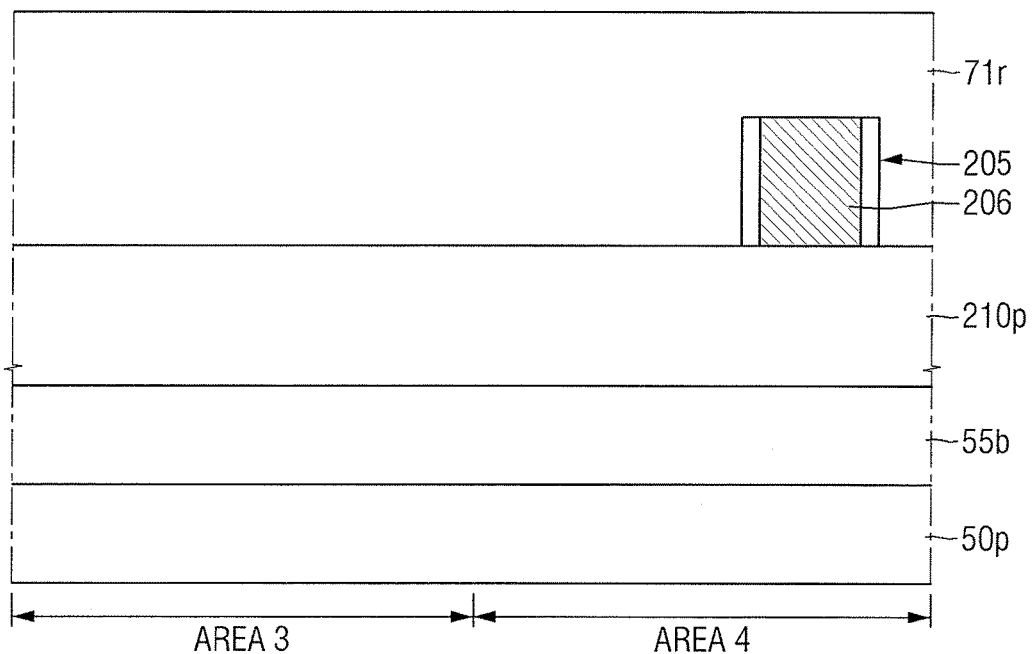
FIGS. 31 and 32 illustrate cross-sectional views of intermediate stages in a method for fabricating a semiconductor device according to some exemplary embodiments.
Figure 32:
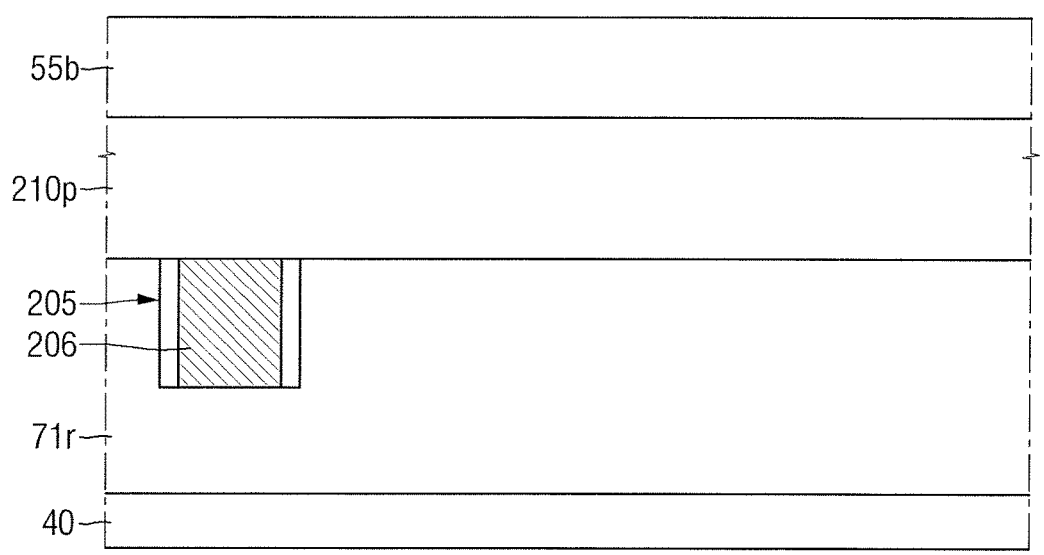

FIGS. 31 and 32 are cross-sectional views along line I-I of FIG. 1 illustrating intermediate stages in a method for fabricating a semiconductor device according to some exemplary embodiments.

Referring to FIG. 31, a second pre-lower interlayer insulating film 71r overlying the second device pattern 205 may be formed on the second semiconductor substrate 210p. Referring to FIG. 32, the second pre-lower interlayer insulating film 71r may be bonded to the substrate supporter 40. The dummy base substrate 50p may be removed to expose the dummy buried insulating film 55b.

Then, at least a portion of the dummy buried insulating film 55b, the second semiconductor substrate, and the second pre-lower interlayer insulating film 71r in the third device region AREA 3 (in FIG. 25) may be removed. Thus, the second device substrate structure 205st may be formed on the substrate supporter 40.

FIGS. 33 to 36 are cross-sectional views along line I-I of FIG. 1 illustrating stages in a method for fabricating a semiconductor device according to some exemplary embodiments. Referring to FIGS. 33 to 36, the second substrate 200 may be a silicon substrate rather than the SOI substrate.

Figure 33:
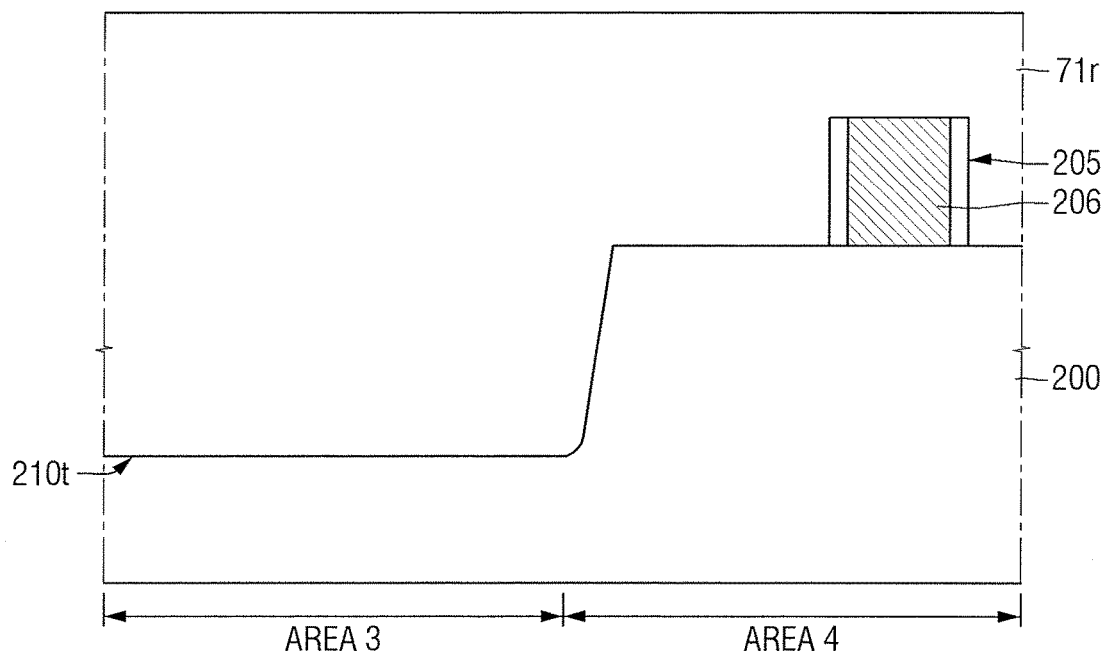
FIGS. 33 to 36 illustrate cross-sectional views of stages in a method for fabricating a semiconductor device according to some exemplary embodiments.

Referring to FIG. 33, at least a portion of the second substrate 200 in the third device region AREA 3 where the second device pattern 205 is not formed may be removed to form the second substrate trench 210t. A second pre-lower interlayer insulating film 71r overlying the second device pattern 205 and filling the second substrate trench 210t may be formed on the second substrate 200.

Figure 34:
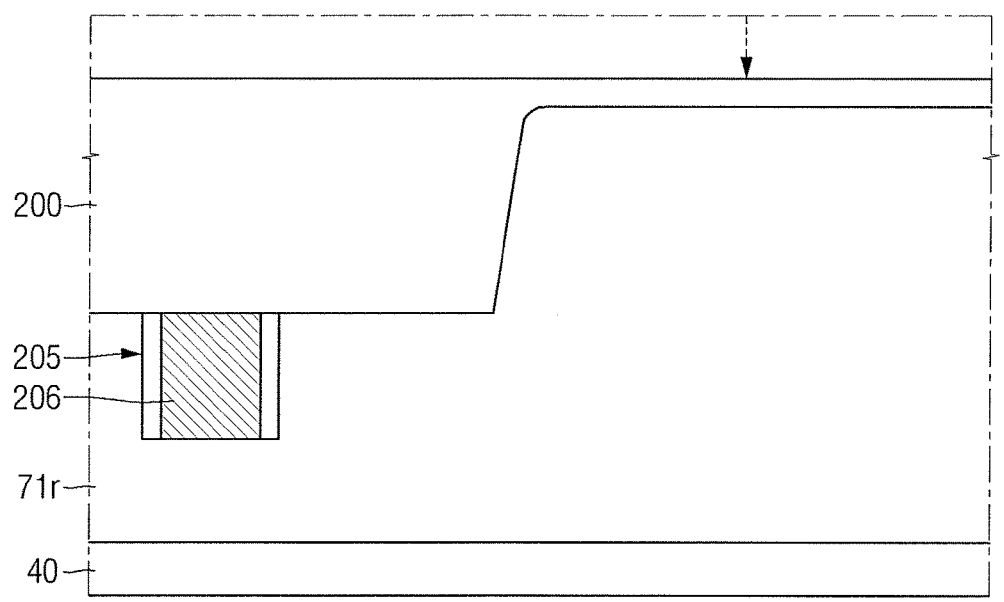

Referring to FIG. 34, the second pre-lower interlayer insulating film 71r may be bonded to the substrate supporter 40. The thickness of the second substrate 200 may be reduced by removing a portion of the second substrate 200 bonded to the substrate supporter 40.

Figure 35:
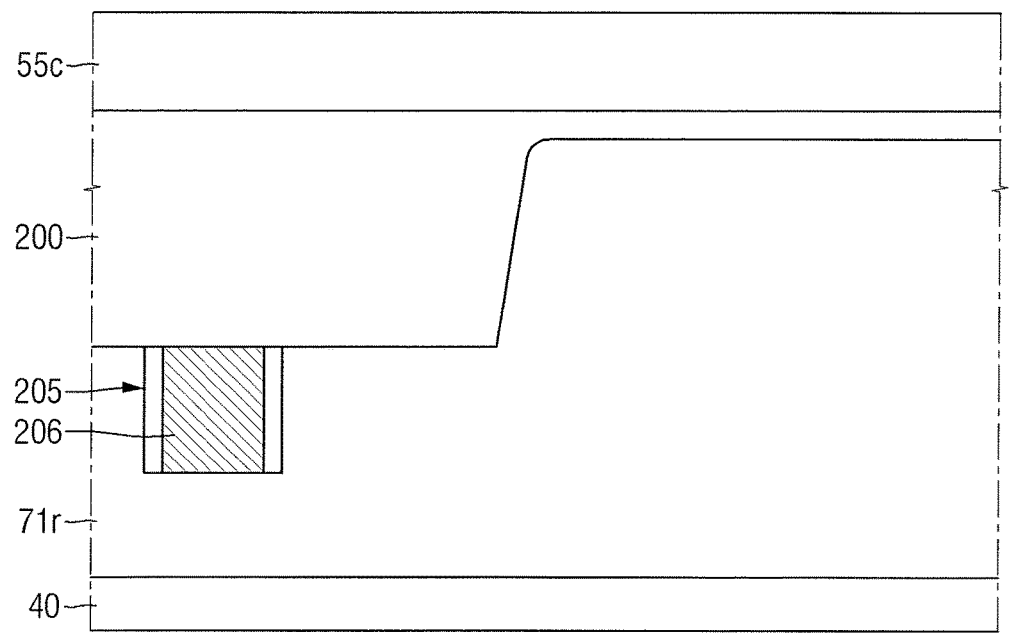

Referring to FIG. 35, a junction insulating film 55c may be formed on the second substrate 200 of which thickness is reduced. The junction insulating film 55c may include silicon oxide.

Figure 36:
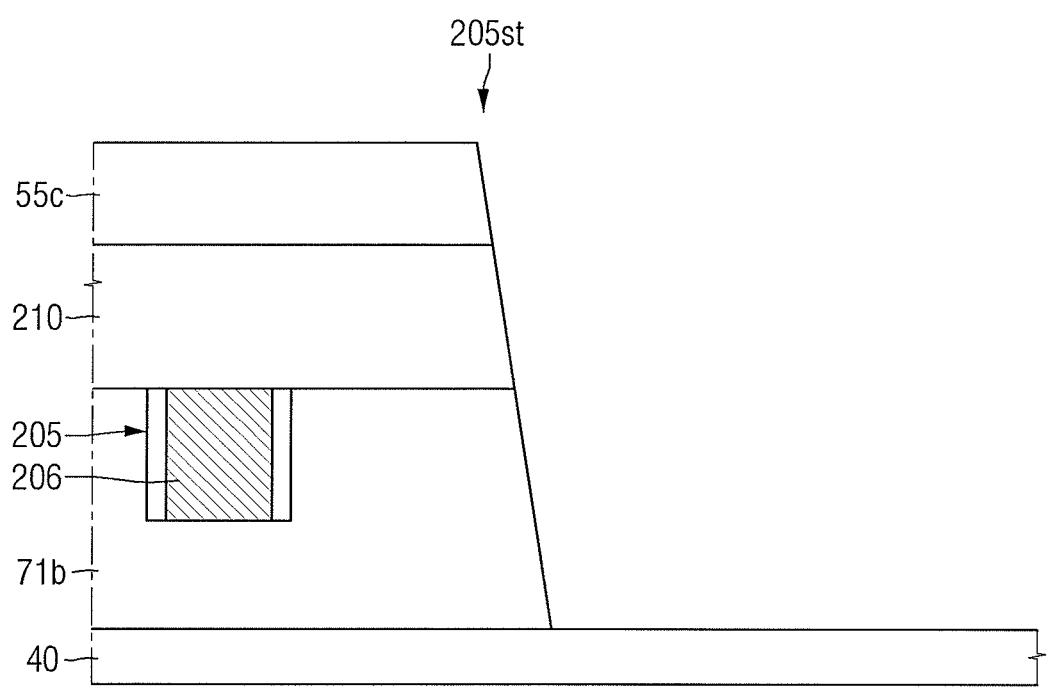

Referring to FIG. 36, at least a portion of the junction insulating film 55c and the second pre-lower interlayer insulating film 71r in the third device region AREA 3 may be removed to form the second portion 71b of the first lower interlayer insulating film on the fourth device region AREA 4. Thus, the second device substrate structure 205st may be formed on the substrate supporter 40.

By way of summation and review, a semiconductor device according to embodiments has improved device density and improved device characteristics by forming respective device patterns having different characteristics, e.g., different materials, shapes, crystallinity, etc., on different substrates and then joining the respective device patterns to one substrate. A semiconductor device according to embodiments has also improved device density and improved device characteristics by using different processes and then joining the respective device patterns to one substrate.

That is, after semiconductor elements having different characteristics are formed on different respective substrates, the individual semiconductor elements are separated and joined to fit a desired layout, e.g., to be on a single, continuous base substrate. Since it is necessary to attach a semiconductor device using a bond between silicon oxides after smart cut, each device is formed by using an SOI substrate as a base substrate, then a semiconductor device is separated using a smart cut and then bonded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a base substrate;
a buried insulating film on the base substrate;
a first semiconductor substrate pattern on the buried insulating film;
a second semiconductor substrate pattern on the buried insulating film, the second semiconductor substrate pattern being spaced apart from the first semiconductor substrate pattern;
a first device pattern including a first gate electrode on the first semiconductor substrate pattern;
a second device pattern including a second gate electrode on the second semiconductor substrate pattern;
an isolating trench between the first semiconductor substrate pattern and the second semiconductor substrate pattern and within the buried insulating film, the isolating trench including a first sidewall and a second sidewall facing each other; and
a lower interlayer insulating film overlying the first device pattern and the second device pattern and completely filling the isolating trench,
wherein the first sidewall of the isolating trench is defined by the first semiconductor substrate pattern and the buried insulating film, and the second sidewall of the isolating trench is defined by the second semiconductor substrate pattern and the buried insulating film,
wherein a first part of the first sidewall of the isolating trench defined by the first semiconductor substrate pattern and a second part of the first sidewall of the isolating trench defined by the buried insulating film are continuous with each other, and
wherein a first part of the second sidewall of the isolating trench defined by the second semiconductor substrate pattern and a second part of the second sidewall of the isolating trench defined by the buried insulating film are continuous with each other.

2. The semiconductor device as claimed in claim 1, wherein:
each of the first semiconductor substrate pattern and the second semiconductor substrate pattern includes a lower surface facing the buried insulating film,
the lower surface of the first semiconductor substrate pattern and the first part of the first sidewall of the isolating trench defined by the first semiconductor substrate pattern define an acute angle, and
the lower surface of the second semiconductor substrate pattern and at least a portion of the second sidewall of the isolating trench defined by the second semiconductor substrate pattern define an acute angle.

3. The semiconductor device as claimed in claim 1, wherein:
each of the first semiconductor substrate pattern and the second semiconductor substrate pattern includes a lower surface facing the buried insulating film,
the lower surface of the first semiconductor substrate pattern and the first part of the first sidewall of the isolating trench defined by the first semiconductor substrate pattern define an acute angle, and
the lower surface of the second semiconductor substrate pattern and the first part of the second sidewall of the isolating trench defined by the second semiconductor substrate pattern define an obtuse angle.

4. The semiconductor device as claimed in claim 1, wherein the first sidewall of the isolating trench and a bottom surface of the isolating trench define an obtuse angle, and the second sidewall of the isolating trench includes an obtuse angle portion and an acute angle portion with respect to the bottom surface of the isolating trench.

5. The semiconductor device as claimed in claim 1, further comprising:
a first etch stop layer extending along at least a portion of the first device pattern on the first semiconductor substrate pattern, and a second etch stop layer extending along at least a portion of the second device pattern on the second semiconductor substrate pattern, wherein the first etch stop layer and the second etch stop layer are spaced apart from each other, the lower interlayer insulating film being on the first and second etch stop layers.

6. The semiconductor device as claimed in claim 1, further comprising:
 an upper interlayer insulating film on the lower interlayer insulating film; and
 an integration interconnect wire within the upper interlayer insulating film, a portion of the integration interconnect wire extending across the isolating trench.

7. The semiconductor device as claimed in claim 6, further comprising:
 a first interconnect wire within the lower interlayer insulating film in a region overlapping the first semiconductor substrate pattern; and
 a second interconnect wire within the lower interlayer insulating film in a region overlapping the second semiconductor substrate pattern, the integration interconnect wire electrically connecting the first interconnect wire to the second interconnect wire.

8. The semiconductor device as claimed in claim 1, wherein:
 the first device pattern includes a first transistor, and the second device pattern includes a second transistor, and
 a shape of a channel region of the first transistor is different from that of a channel region of the second transistor.

9. The semiconductor device as claimed in claim 1, wherein:
 the first device pattern includes a first transistor, and the second device pattern includes a second transistor, and
 a material of a channel region of the first transistor is different from a material of a channel region of the second transistor.

10. The semiconductor device as claimed in claim 1, further comprising:
 a third semiconductor substrate pattern on the lower interlayer insulating film, the third semiconductor substrate pattern including a first surface and a second surface facing each other; and
 a third device pattern on the first surface of the third semiconductor substrate pattern.

11. The semiconductor device as claimed in claim 10, wherein the second surface of the third semiconductor substrate pattern faces the lower interlayer insulating film.

12. The semiconductor device as claimed in claim 11, further comprising:
 an insertion insulating film between the third semiconductor substrate pattern and the lower interlayer insulating film; and
 a through-electrode penetrating through the insertion insulating film.

13. The semiconductor device as claimed in claim 10, wherein the first surface of the third semiconductor substrate pattern faces the lower interlayer insulating film.

14. The semiconductor device as claimed in claim 13, further comprising:
 an upper interlayer insulating film,
 a first wire structure within the lower interlayer insulating film, the first wire structure being electrically connected to the first device pattern and the second device pattern, and
 a second wire structure within the upper interlayer insulating film, the second wire structure being electrically connected to the third device pattern, and the first wire structure being connected to the second wire structure.

15. The semiconductor device as claimed in claim 1, wherein:
 a connecting portion between the first sidewall of the isolating trench and a bottom surface of the isolating trench is rounded, and
 a connecting portion between, the second sidewall of the isolating trench and the bottom surface of the isolating trench is not rounded.

16. The semiconductor device as claimed in claim 1, wherein the isolating trench between the first semiconductor substrate pattern and the second semiconductor substrate pattern extends only partially into the buried insulating film.

17. The semiconductor device as claimed in claim 1, wherein the base substrate is a single, continuous substrate, the first and second device patterns being on the same base substrate.

18. The semiconductor device as claimed in claim 16, wherein the buried insulating film extends continuously on the base substrate to overlap bottom surfaces of the first and second device patterns.

19. The semiconductor device as claimed in claim 1, wherein lateral sidewalls of the first semiconductor substrate pattern and the buried insulating film are level with each other to define the first sidewall of the isolating trench, and lateral sidewalls of the second semiconductor substrate pattern and the buried insulating film are level with each other to define the second sidewall of the isolating trench.

20. The semiconductor device as claimed in claim 19, wherein the first sidewall of the isolating trench and the second sidewall of the isolating trench are in the same isolating trench, the first and second sidewalls being inclined in a same direction with respect to a bottom surface of the buried insulating film.

* * * * *